United States Patent
Pang et al.

(10) Patent No.: US 9,490,262 B1
(45) Date of Patent: Nov. 8, 2016

(54) SELECTIVE REMOVAL OF CHARGE-TRAPPING LAYER FOR SELECT GATE TRANSISTOR AND DUMMY MEMORY CELLS IN 3D STACKED MEMORY

(71) Applicant: SanDisk Technologies Inc., Plano, TX (US)

(72) Inventors: Liang Pang, Fremont, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/143,922

(22) Filed: May 2, 2016

Related U.S. Application Data

(62) Division of application No. 14/690,863, filed on Apr. 20, 2015, now Pat. No. 9,406,693.

(51) Int. Cl.
| | |
|---|---|
| H01L 27/115 | (2006.01) |
| H01L 29/66 | (2006.01) |
| H01L 21/28 | (2006.01) |
| H01L 21/306 | (2006.01) |
| H01L 21/265 | (2006.01) |

(52) U.S. Cl.
CPC ....... *H01L 27/11582* (2013.01); *H01L 21/265* (2013.01); *H01L 21/28282* (2013.01); *H01L 21/30604* (2013.01); *H01L 27/1157* (2013.01); *H01L 29/66545* (2013.01); *H01L 29/66833* (2013.01)

(58) Field of Classification Search
CPC .................. H01L 27/11582; H01L 27/11563; H01L 21/28282
See application file for complete search history.

(56) References Cited

U.S. PATENT DOCUMENTS

| | | | |
|---|---|---|---|
| 7,239,556 B2 | 7/2007 | Abe et al. | |
| 8,228,735 B2 | 7/2012 | Puzzilli et al. | |
| 8,283,228 B2 | 10/2012 | Alsmeier | |
| 8,415,742 B2 | 4/2013 | Kim et al. | |
| 8,946,807 B2 | 2/2015 | Hopkins et al. | |
| 9,209,031 B2 | 12/2015 | Baenninger et al. | |
| 2014/0332873 A1* | 11/2014 | Yoo .................. | H01L 27/11556 257/314 |
| 2015/0003161 A1 | 1/2015 | Avila et al. | |
| 2016/0093636 A1 | 3/2016 | Pang et al. | |

OTHER PUBLICATIONS

Kastenmeier, B.E.E., et al., "Chemical dry etching of silicon nitride and silicon dioxide using CF4/O2/N2 gas mixtures," J. Vac. Sci. Technology, A 14(5), Sep./Oct. 1996, 12 pages.

Nayak, Avinash P., et al., "Wet and Dry Etching," University of California, Davis, Jun. 2011, 5 pages.

Restriction Requirement dated Jan. 6, 2016, U.S. Appl. No. 14/690,863, filed Jan. 6, 2016.

Response to Restriction Requirement dated Feb. 10, 2016, U.S. Appl. No. 14/690,863, filed Apr. 20, 2015.

Supplemental Amendment dated Mar. 4, 2016, U.S. Appl. No. 14/690,863, filed Apr. 20, 2015.

Notice of Allowance dated Apr. 12, 2016, U.S. Appl. No. 14/690,863, filed Apr. 20, 2015.

\* cited by examiner

*Primary Examiner* — Yu-Hsi D Sun
(74) *Attorney, Agent, or Firm* — Vierra Magen Marcus LLP

(57) ABSTRACT

Fabrication techniques for a three-dimensional stack memory device remove the charge-trapping material from the select gate transistors and the dummy memory cells to avoid unintentional programming which increases the threshold voltage. In one approach, a stack is formed with a sacrificial material for the a) control gate layers of the select gate transistors and the dummy memory cells and the b) control gate layers of the data memory cells. A slit is formed to allow etchants to be introduced to selectively remove the sacrificial material and then the charge-trapping material for the select gate transistors and dummy memory cells. A protective layer is provided partway in the slit, or the slit is etched in two steps.

10 Claims, 39 Drawing Sheets

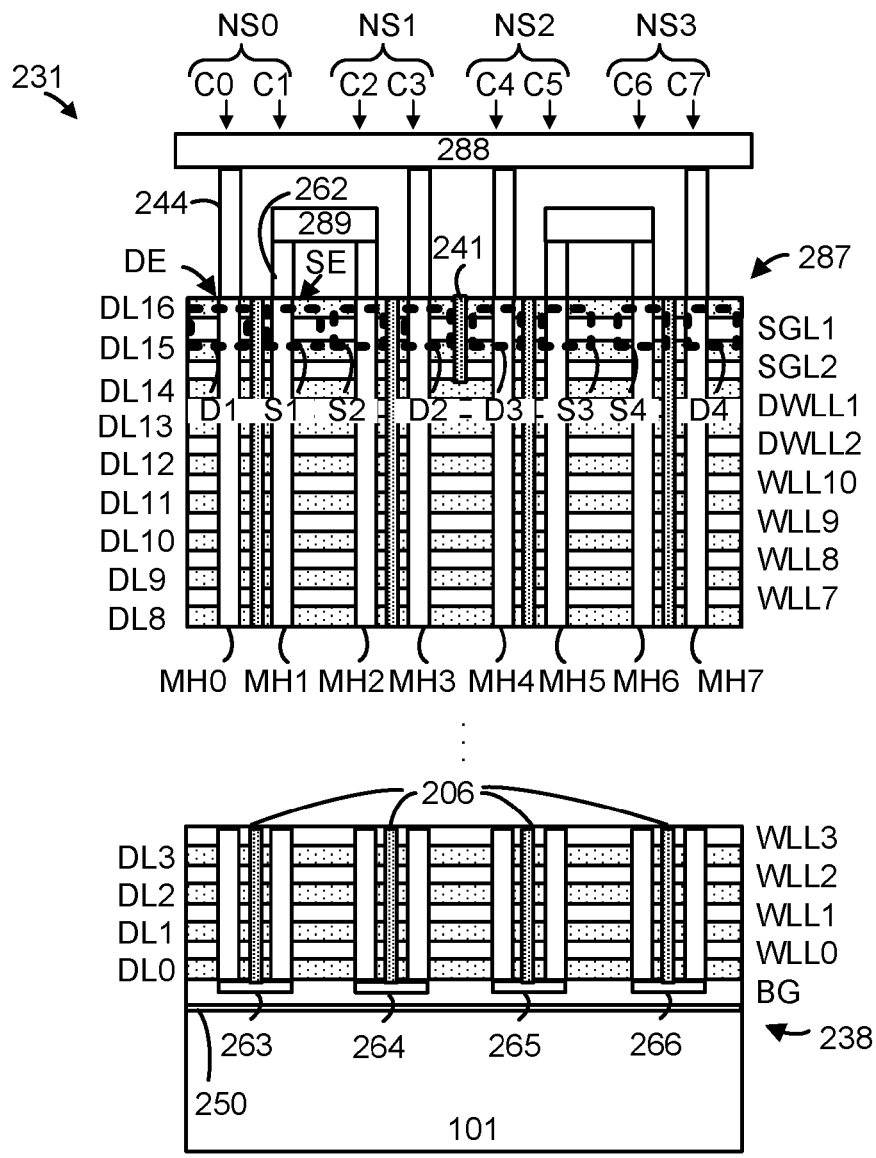

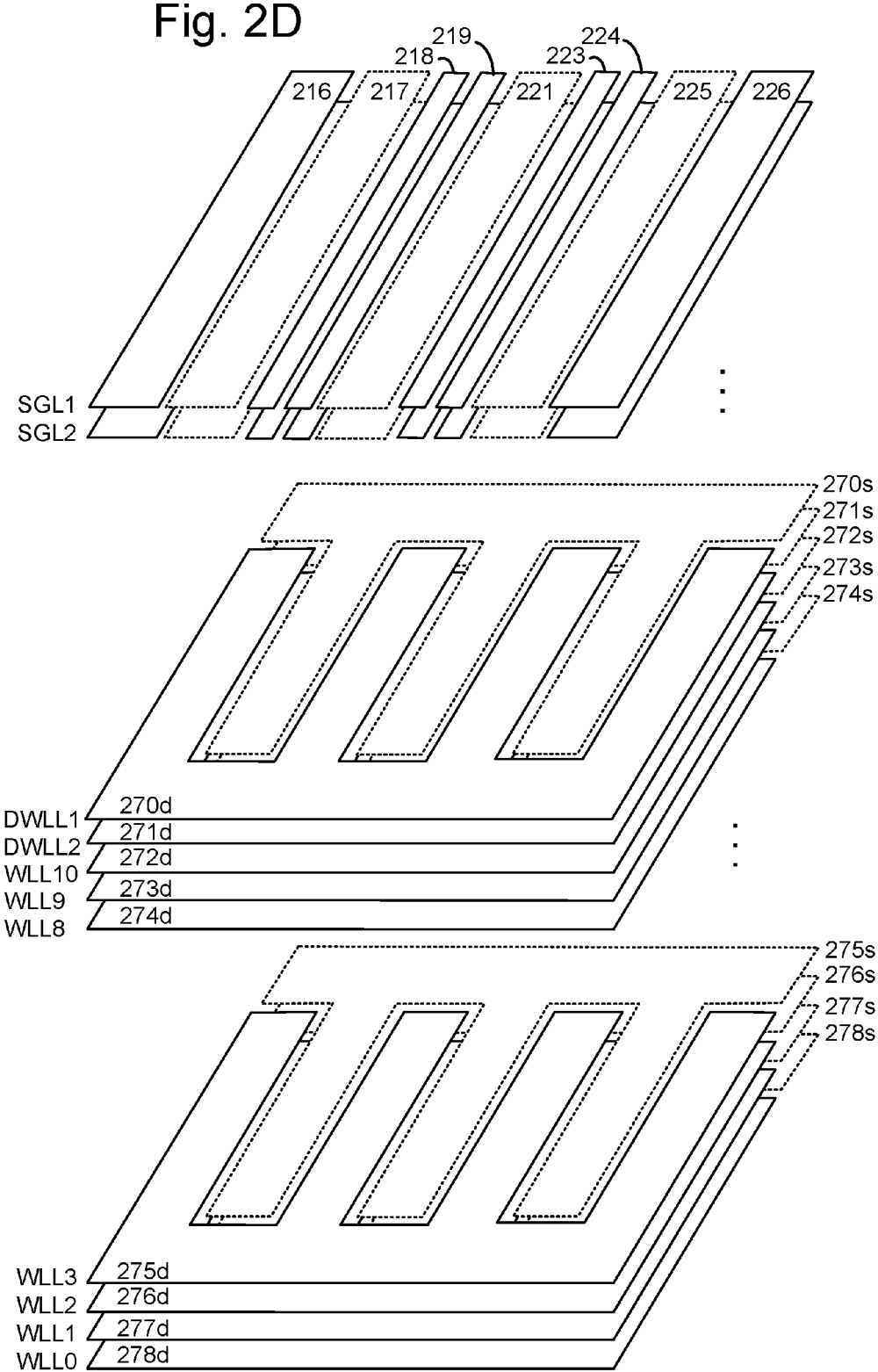

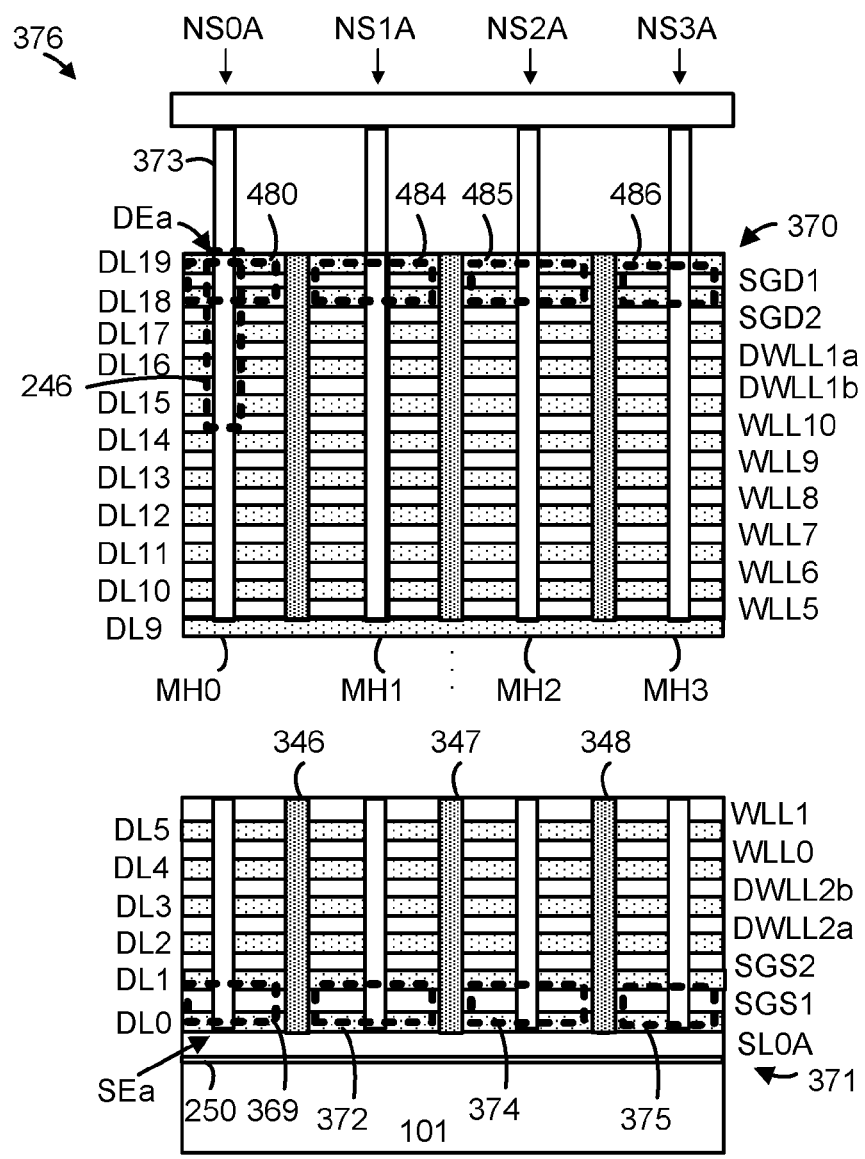

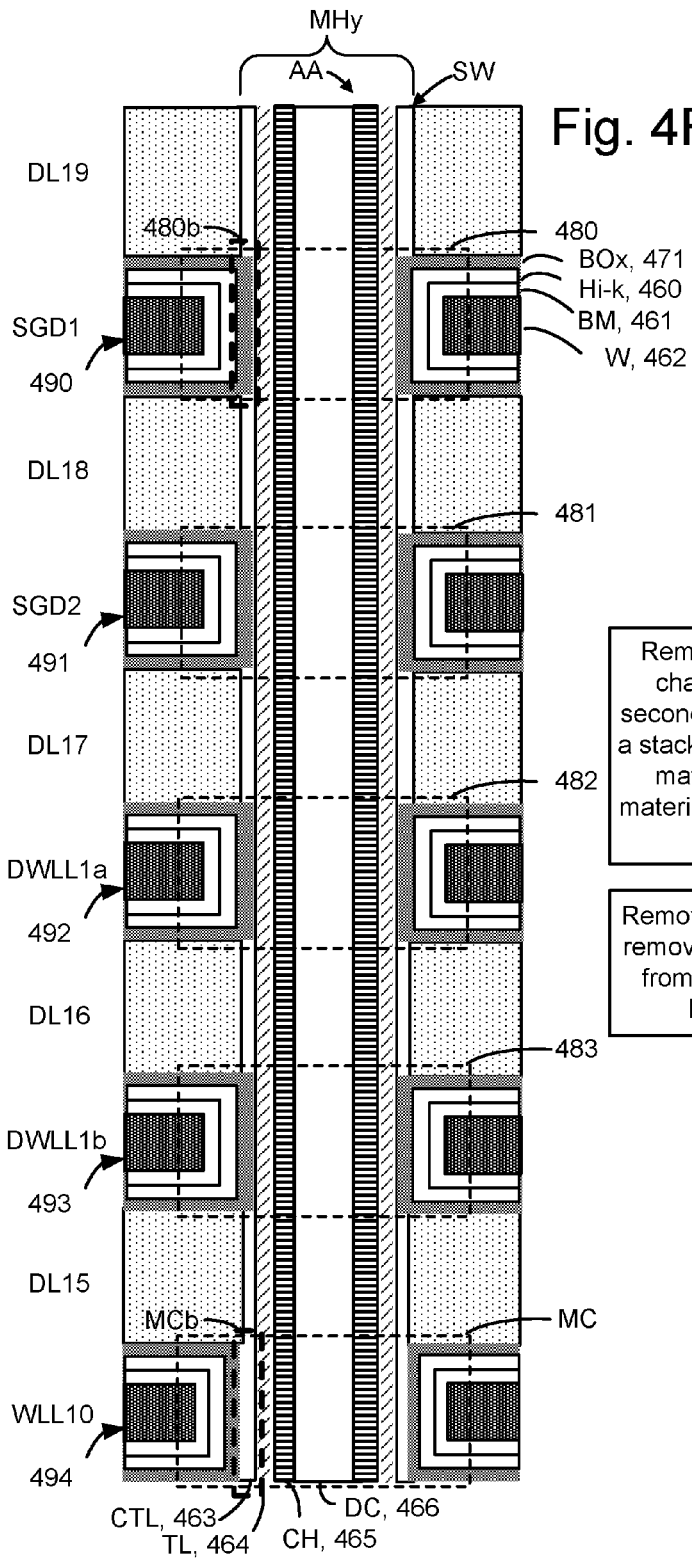

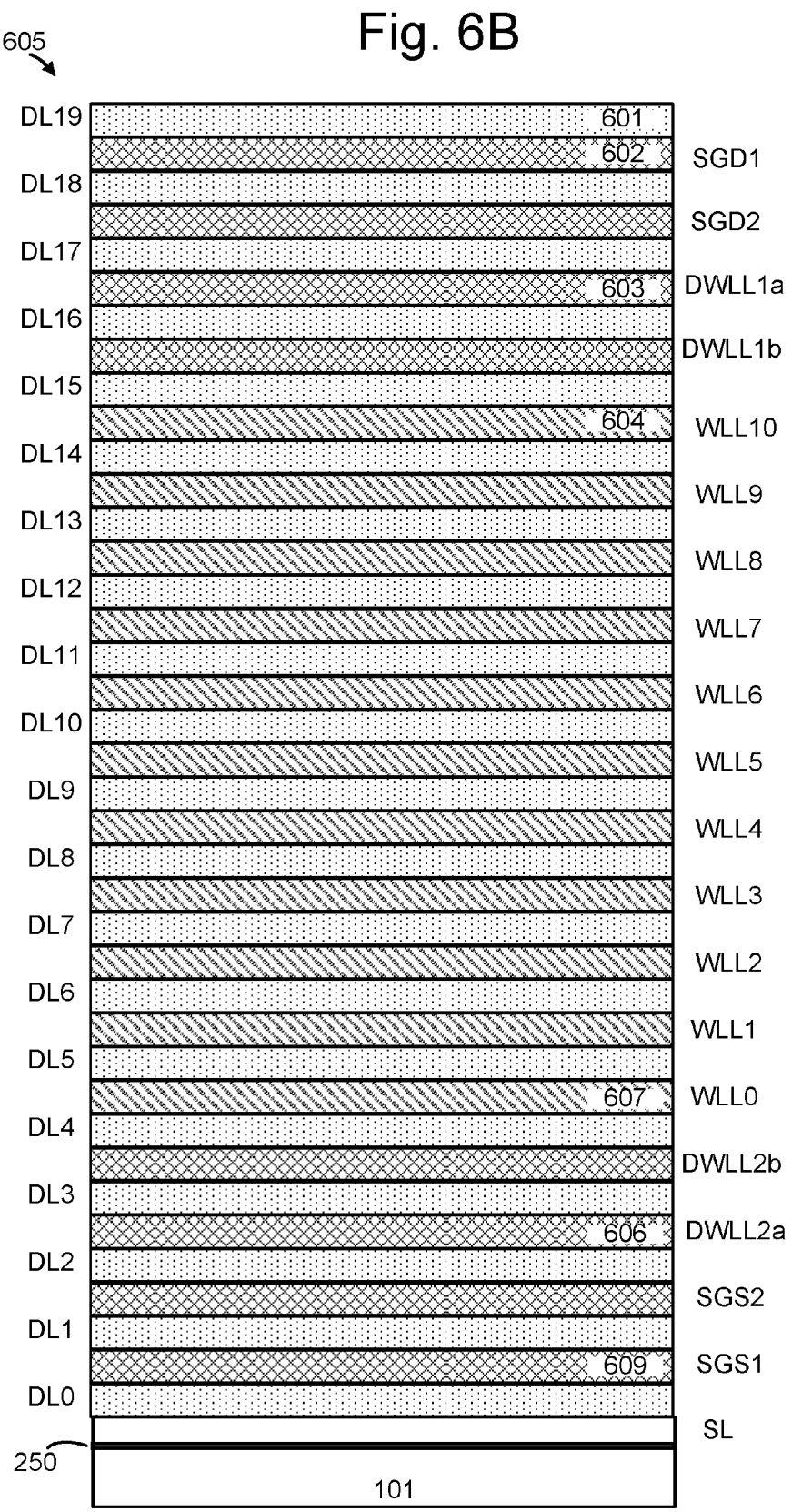

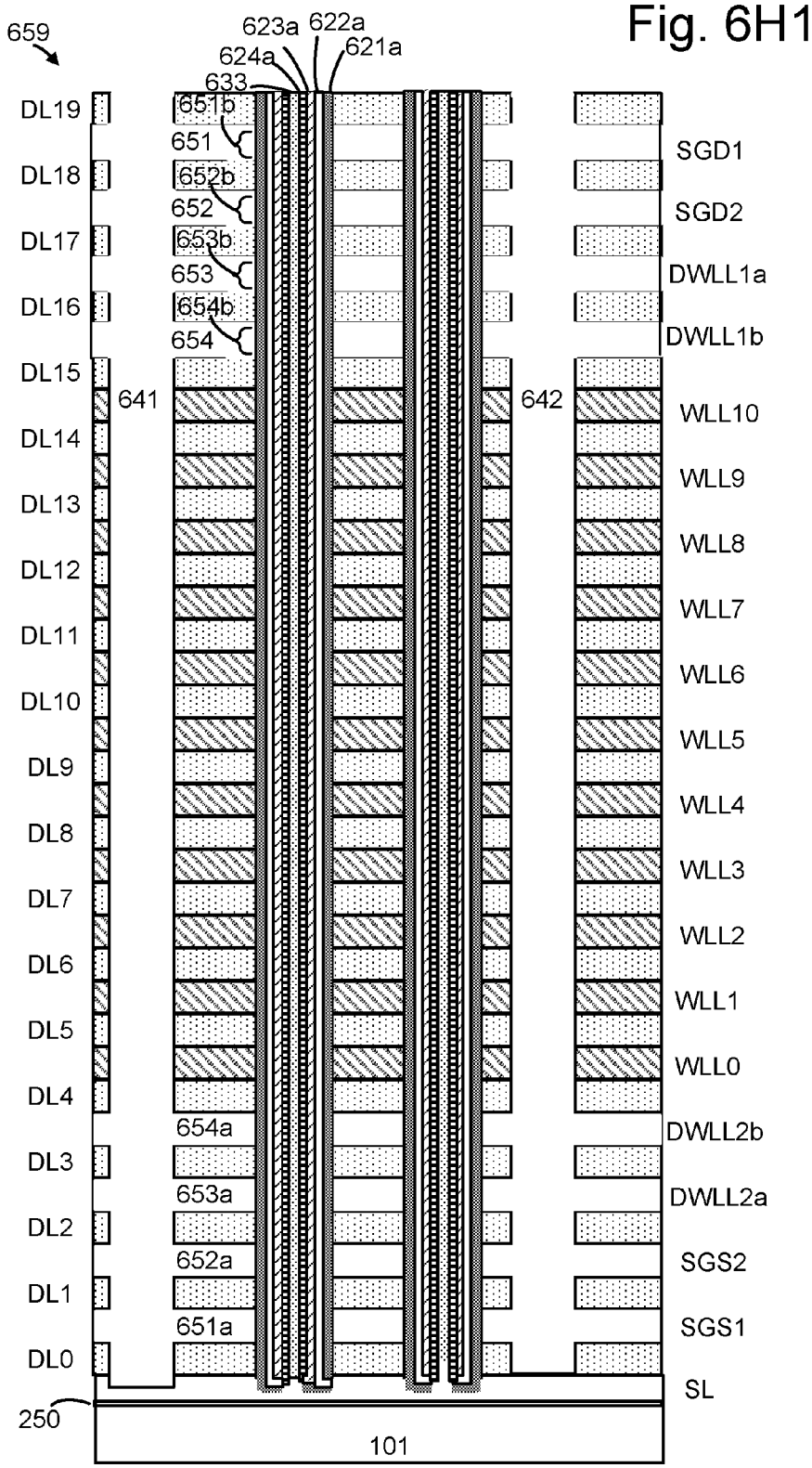
Fig. 6H1

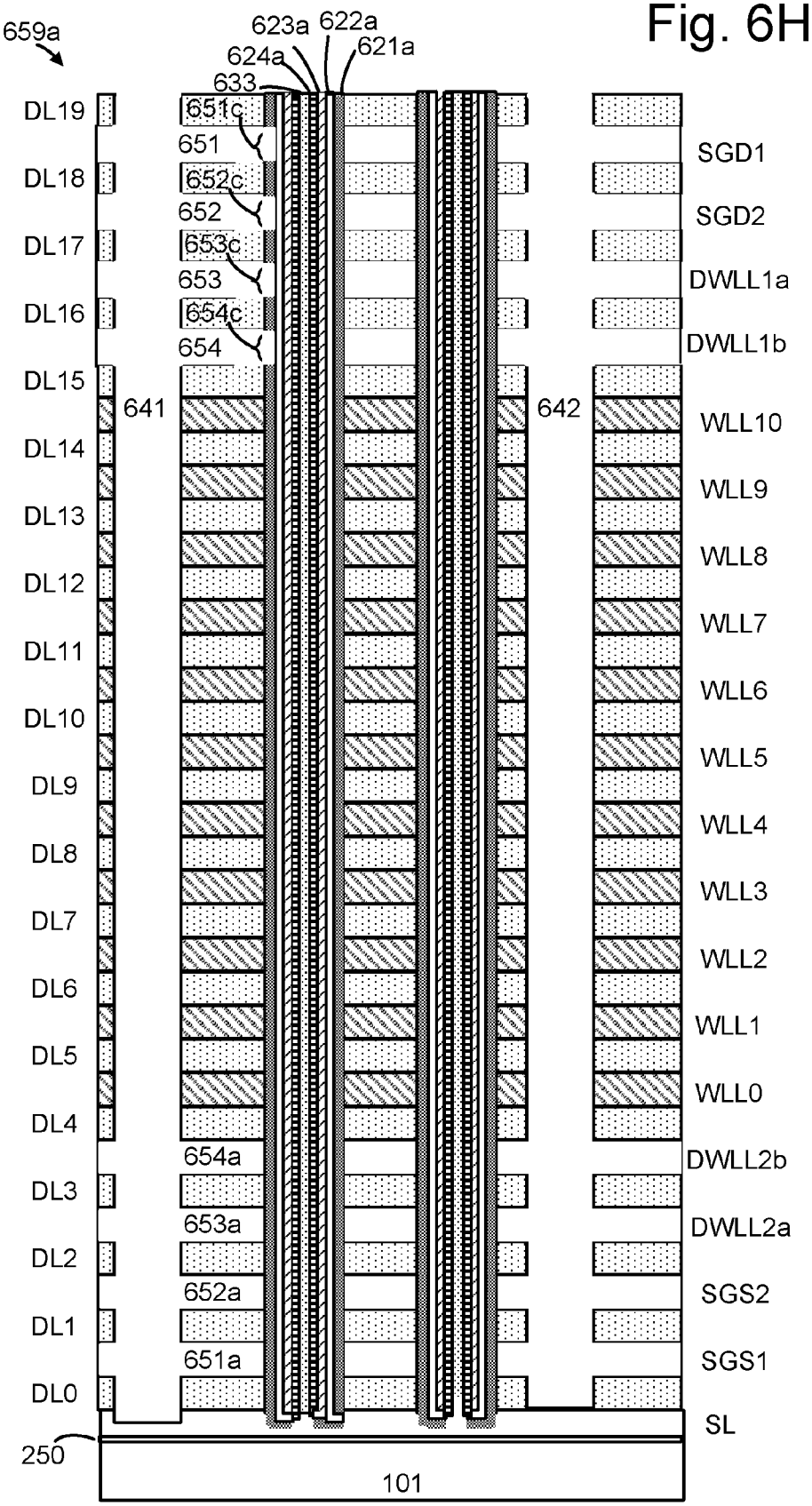
Fig. 6H2

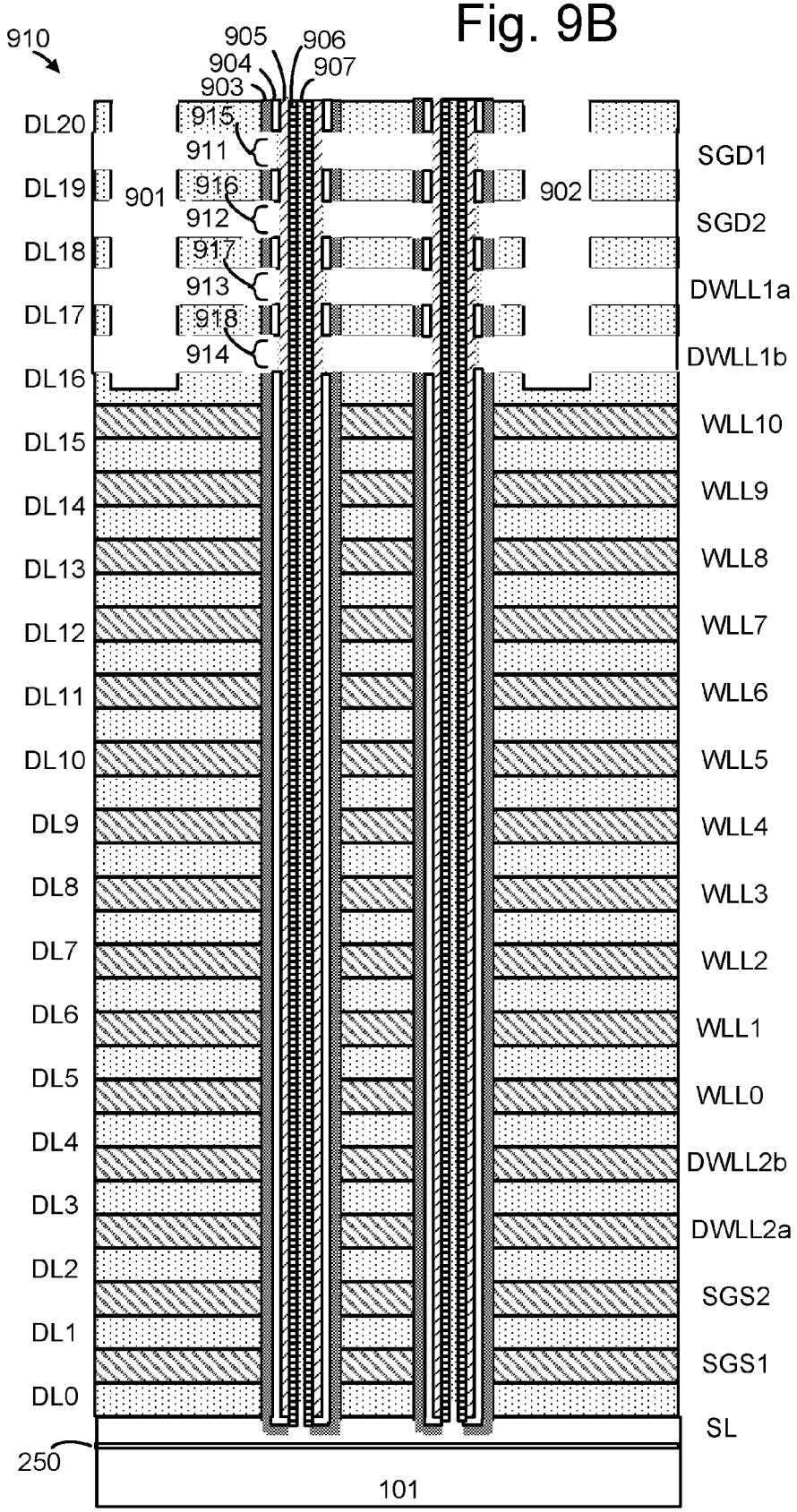

SELECTIVE REMOVAL OF CHARGE-TRAPPING LAYER FOR SELECT GATE TRANSISTOR AND DUMMY MEMORY CELLS IN 3D STACKED MEMORY

CLAIM OF PRIORITY

This application is a divisional application of U.S. patent application Ser. No. 14/690,863, entitled "SELECTIVE REMOVAL OF CHARGE-TRAPPING LAYER FOR SELECT GATE TRANSISTORS AND DUMMY MEMORY CELLS IN 3D STACKED MEMORY," filed Apr. 20, 2015 and issued as U.S. Pat. No. 9,406,693 on Aug. 2, 2016, incorporated herein by reference in its entirety.

BACKGROUND

The present technology relates to the fabrication of a memory device.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells and of select gate transistors are provided by the conductive layers.

However, various challenges are presented in operating such memory devices.

BRIEF DESCRIPTION OF THE DRAWINGS

Like-numbered elements refer to common components in the different figures.

FIG. 2C depicts an embodiment of a stack 231 showing a cross-sectional view of the portion 209 of FIG. 2A, along line 220, where select gate layers SGL1 and SGL2 are provided.

FIG. 2D depicts an alternative view of the select gate layers and word line layers of the stack 231 of FIG. 2C.

FIG. 3C depicts an embodiment of a stack 376 showing a cross-sectional view of the portion 307 of FIG. 3A, along line 305.

FIG. 4F depicts a view of the region 246 of FIG. 3C or the region 442 of FIG. 4C1, where a blocking oxide layer is provided within the control gate layers.

FIG. 4G depicts an overview of the fabrication process of FIG. 5.

FIG. 6B depicts a semiconductor structure 605 comprising a stack of alternating control gate layers and dielectric layers in accordance with steps 500 and 500a of FIG. 5, in an option where source-side control gate layers also have a different sacrificial material than the control gate layers of the data memory cells.

FIG. 6H1 depicts a semiconductor structure 659 which is an alternative to the semiconductor structure of FIG. 6G, in an option in which the sacrificial material is also removed for the source-side select gate layers and dummy memory cells, consistent with the semiconductor structure of FIG. 6B.

FIG. 6H2 depicts a semiconductor structure 659a obtained by processing the semiconductor structure of FIG. 6H1 in accordance with step 508 of FIG. 5.

FIG. 9B depicts a semiconductor structure 910 obtained by processing the semiconductor structure of FIG. 9A in accordance with steps 507 and 509b of FIG. 5.

DETAILED DESCRIPTION

Figure 1A:
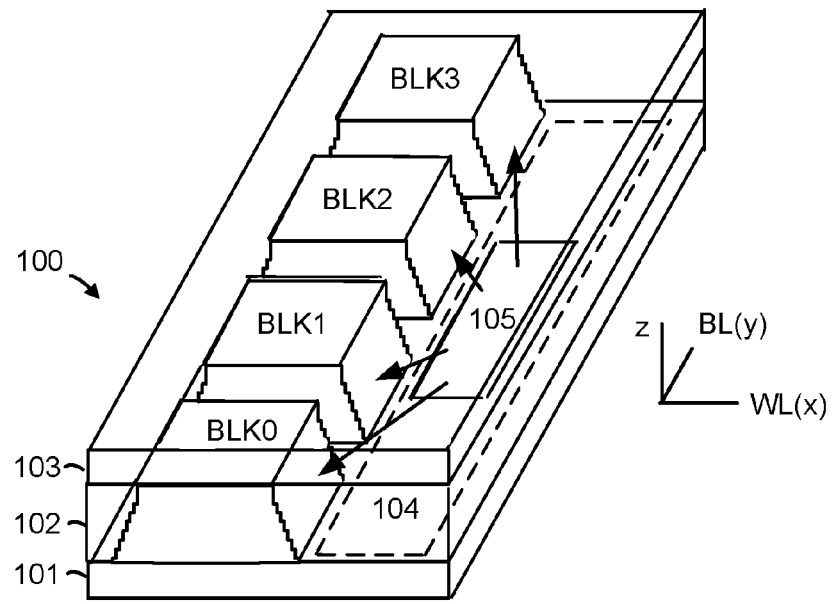
FIG. 1A is a perspective view of a set of blocks in a 3D stacked non-volatile memory device.

Techniques are provided for fabricating a 3D stacked non-volatile memory device in which the charge-trapping layer is removed from select gate transistors and/or dummy memory cells. A corresponding 3D stacked non-volatile memory device is also provided.

A 3D stacked non-volatile memory device has a multi-layer configuration in which conductive layers alternate with dielectric layers in a stack. Memory holes are etched in the stack and films are deposited in the holes such that memory cells or select gate transistors are formed where the conductive layers intersect with the memory holes. The films can include a charge-trapping material, a tunneling material and a channel material. Some of the conductive layers (e.g., control gate layers) are used as control gates for memory cells and other conductive layers are used as control gates for select gate transistors, such as drain- or source-side transistors in NAND strings. The NAND strings extend vertically in the memory device. The charge-trapping material can be silicon nitride or other nitride, for instance. The memory cells can include data memory cells, which are eligible to store data, and dummy memory cells, which are not eligible to store data, but provide a transition region between a select gate and the data memory cells.

However, unintentional programming can occur for the select gate transistors and/or dummy memory cells during program-erase (P-E) operations for the data memory cells. For example, during an erase operation, the channel of a NAND string is charged by biasing the select gate transistors at the drain-side of the NAND string to generate holes by gate-induced drain leakage (GIDL). A relatively high erase voltage is applied to the drain-side via a bit line while control gate voltages are set on the dummy memory cells and the select gate transistors. The holes diffuse throughout the channel of the NAND string to charge up the channel. However, it takes some time for the holes to diffuse. As a result, at a beginning of the erase voltage, the dummy memory cells and the select gate transistors will experience a relatively high gate-to-channel voltage which can induce weak Fowler-Nordheim (F-N) tunneling. This F-N tunneling gradually programs the dummy memory cells and the select gate transistors over time as P-E cycles accumulate. The resulting increase in the threshold voltage (Vth) of the dummy memory cells and the select gate transistors can impair the ability of the NAND string to operate. For example, during sensing and programming operations, the increase in the Vth may prevent the dummy memory cells and the select gate transistors from being fully conductive.

Fabrication processes provided herein remove portions of the charge-trapping layer which are located in the control gate layers of the dummy memory cells and/or the select gate transistors so that the dummy memory cells and/or the select gate transistors cannot have their Vth increased due to unintentional programming. The dummy memory cells and/or the select gate transistors no longer have a charge-trapping material. The charge-trapping layer can be removed in a self-aligned manner so that no additional lithography is required in the fabrication of the memory device. Moreover, these processes are compatible with existing fabrication techniques.

In one approach, a first sacrificial material of the control gate layers for the dummy memory cells and the select gate transistors is different than a second sacrificial material of the data memory cells. As a result, when a slit is formed in the stack, an etchant can be introduced which is more selective of the first sacrificial material than of the second sacrificial material. For example, the first sacrificial material can comprise polysilicon while the second sacrificial material can comprise silicon nitride. Horizontally-extending voids can thereby be created in the control gate layers for the dummy memory cells and the select gate transistors to expose portions of the charge-trapping material in a memory hole. Another etchant can be introduced to remove the exposed portions of the charge-trapping material. Subsequently, a further etchant can be introduced to remove the sacrificial material of the data memory cells to create voids in the control gate layers of the data memory cells. Portions of the charge-trapping material in the control gate layers for the data memory cells remain in the memory device.

A blocking oxide can be provided in the memory holes and/or the voids. Finally, a metal can be introduced which fill the voids to concurrently form control gate layers for the dummy memory cells, the select gate transistors and the data memory cells.

The threshold voltages of the dummy memory cells and/or the select gate transistors can be adjusted using a dopant. For example, in one approach, the dopant can be applied to the top of the stack using ion implantation. In another possible approach, the dopant can be applied laterally in the voids. Both approaches could be combined as well.

In another possible approach, a common sacrificial material can be used for the control gate layers for the dummy memory cells, the select gate transistors and the data memory cells. A slit is formed in the stack, and a protective layer is deposited and etched down in the slit to a specified height which is between a bottommost control gate layer of the control gate layers for the dummy memory cells and/or the select gate transistors and a topmost control gate layer of the control gate layers for the data memory cells. The sacrificial material of the control gate layers for the dummy memory cells and/or the select gate transistors can then be etched away to access the associated portions of the charge-trapping material. Subsequently, the remainder of the protective layer is etched away and the sacrificial material of the control gate layers for the data memory cells can be etched away. The blocking oxide and the metal can be provided as discussed.

In another possible approach, a common sacrificial material can be used for the control gate layers for the dummy memory cells, the select gate transistors and the data memory cells. A slit is formed in the stack in a two etching steps. A first etch forms a slit which extends partway through the stack, to the specified height mentioned above. The sacrificial material of the control gate layers for the dummy memory cells and/or the select gate transistors can then be etched away to access the associated portions of the charge-trapping material. Subsequently, a second etch lowers the slit to the bottom of the stack. The sacrificial material of the control gate layers for the data memory cells can then be etched away. The blocking oxide and the metal can again be provided as discussed.

Generally, there can be one or more drain-side select gate transistors and one or more drain-side dummy memory cells in each NAND string. Further, the source-side of each NAND string can include one or more source-side select gate transistors and one or more source-side dummy memory cells. The charge-trapping material can be removed from one or more of these transistors or dummy memory cells in each NAND string. The dummy memory cells and data memory cells are also transistors.

The following discussion provides details of the construction of example memory devices and of related techniques which address the above and other issues.

FIG. 1A is a perspective view of a set of blocks in a 3D stacked non-volatile memory device. The memory device 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, the control gate layers of each block at a common height are connected to one another and to a voltage driver. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
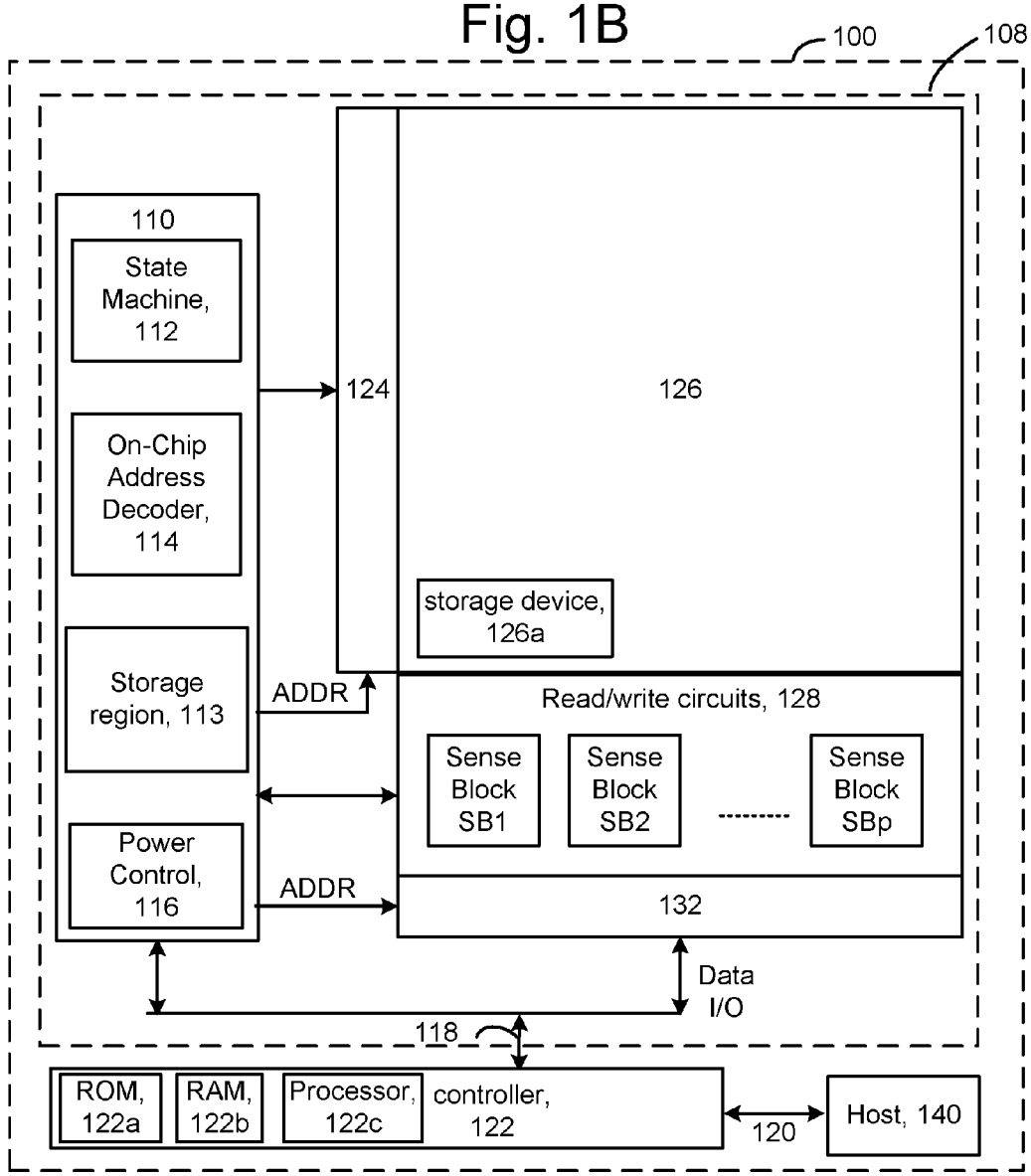
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The set of blocks of FIG. 1A can be on one die. The memory die 108 includes a memory structure 126 of memory cells, such as an array of memory cells, control circuitry 110, and read/write circuits 128. In a 3D configuration, the memory structure can include the blocks of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code may be executed by the processor 122c. The code is used by the controller to access the memory structure such as for programming, read and erase operations. The code can include boot code and control code (set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
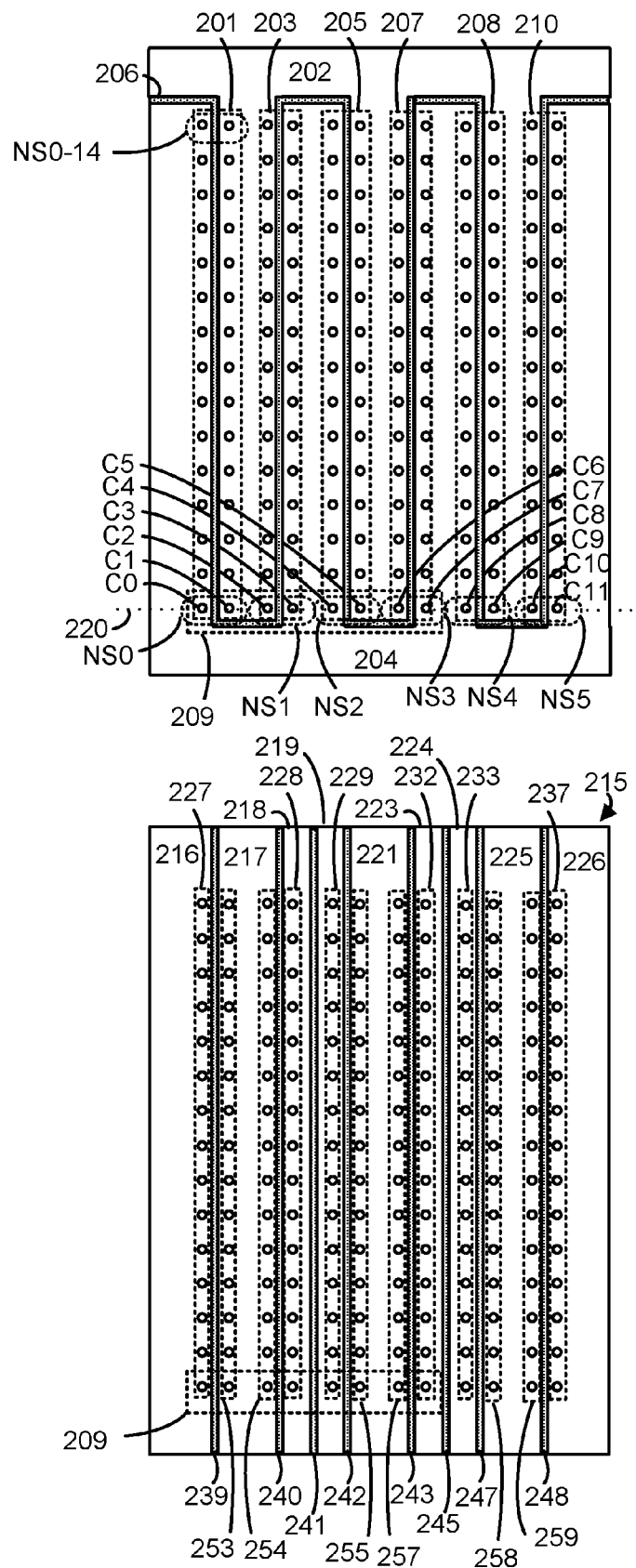
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL16 and may be made of SiO2, for instance. The conductive layers include a back gate layer (BGL), data word line layers WLL0 to WLL10, dummy word line layers DWLL1 and DWLL2, and select gate layers SGL1 and SGL2. The word line layers are conductive paths to control gates of the memory cells at the layer. Moreover, each select gate layer may comprises conductive lines to select gate transistors (e.g., SGD and/or SGS transistors).

As mentioned, a dummy memory cell, also referred to as a non-data memory cell, does not store data, while a data memory cell is eligible to store data. Thus, data memory cells may be programmed to store write data. After a block is erased, all data memory cells are in the erased state. As some word lines are programmed, the corresponding data memory cells store data while other data memory cells do not store data. As a remainder of the block is programmed, all data memory cells typically store data.

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000×24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where select gate layers SGL1 and SGL2 are provided. In this case, the slit extends down to SGL2, so that two separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1 and SGL2) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Generally, a control gate layer can refer to a word line layer, which is connected to dummy memory cells or data memory cells, or a select gate layer, which is connected to select gate transistors.

FIG. 2D depicts an alternative view of the select gate layers and word line layers of the stack 231 of FIG. 2C. The SGL layers SGL1 and SGL2 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL10, WLL9 and WLL8 include drain-side word lines 270d, 271d, 272d, 273d and 274d, respectively, and source-side word lines 270s, 271s, 272s, 273s and 274s, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

Figure 3A:
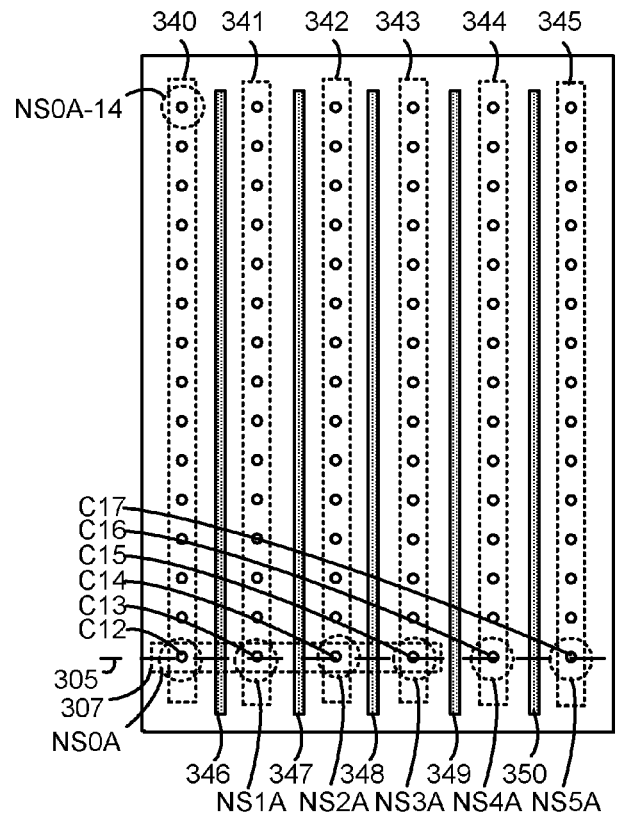
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A. A programming operation for a block can involve programming one set of NAND strings at a time, one word line layer at a time. For example, the memory cells of the NAND string set of region 340 may be programmed first, followed by the memory cells of the NAND string set of region 341, and so forth. Similarly, a read operation for a block can involve sensing one set of NAND strings at a time, while a control gate voltage is applied to a selected word line layer and pass voltages are applied to remaining word line layers.

Alternatively, the layer 304 represents an SGS layer, in which case each circle represents an SGS transistor.

Figure 3B:
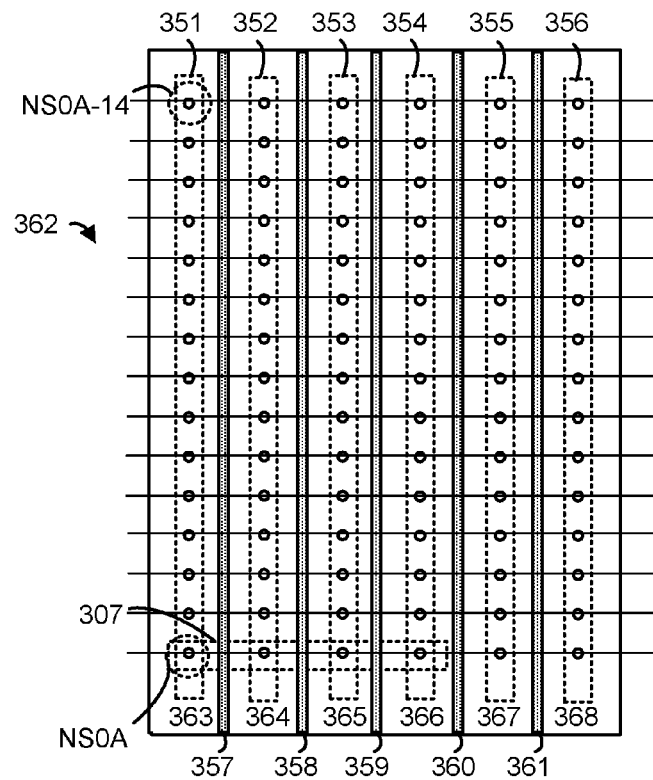
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

Bit lines BLx are also depicted which connect to the top portions of the memory holes. During programming, each portion 363, 364, 365, 366, 367 and 368 is programmed separately and the bit line voltages are set at an inhibit level (e.g., 2-3 V) or a program level (e.g., 0 V).

FIG. 3C depicts an embodiment of a stack 376 showing a cross-sectional view of the portion 307 of FIG. 3A, along line 305. Two SGD layers, two SGS layers and four dummy word line layers DWLL1a, DWLL1b, DWLL2a and DWLL2b are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH3. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Control gate layers (e.g., data word line layers WLL0-WLL10 and dummy word line layers DWLL1a, DWLL1b, DWLL2a and DWLL2b) and dielectric layers (e.g., DL0-DL19), are arranged alternatingly in the stack. SGS transistors 369, 372, 374 and 375 are formed in the SGS1 layer.

Figure 4A:
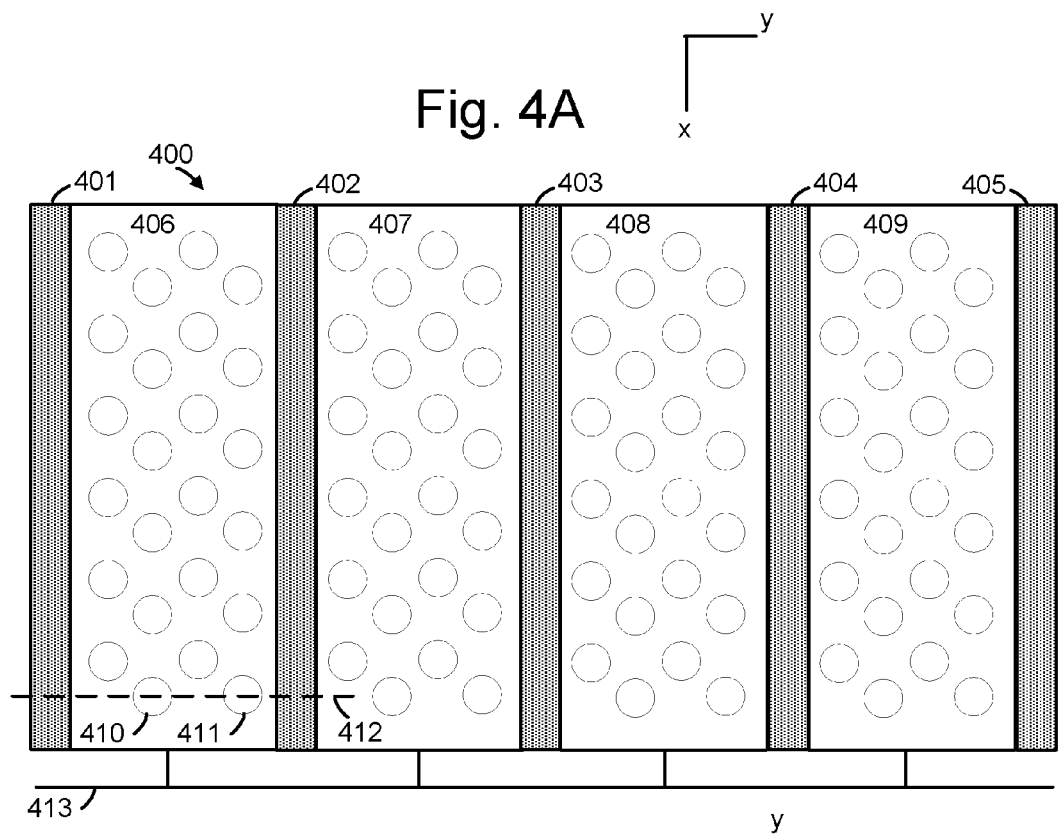
FIG. 4A depicts a top view of an example word line layer 400 of the block BLK0 of FIG. 1A, in another straight NAND string embodiment.

A region 246 of the stack is shown in greater detail in FIG. 4A. SGD transistors 480, 484, 485 and 486 are provided by the dashed-line regions.

Figure 3D:
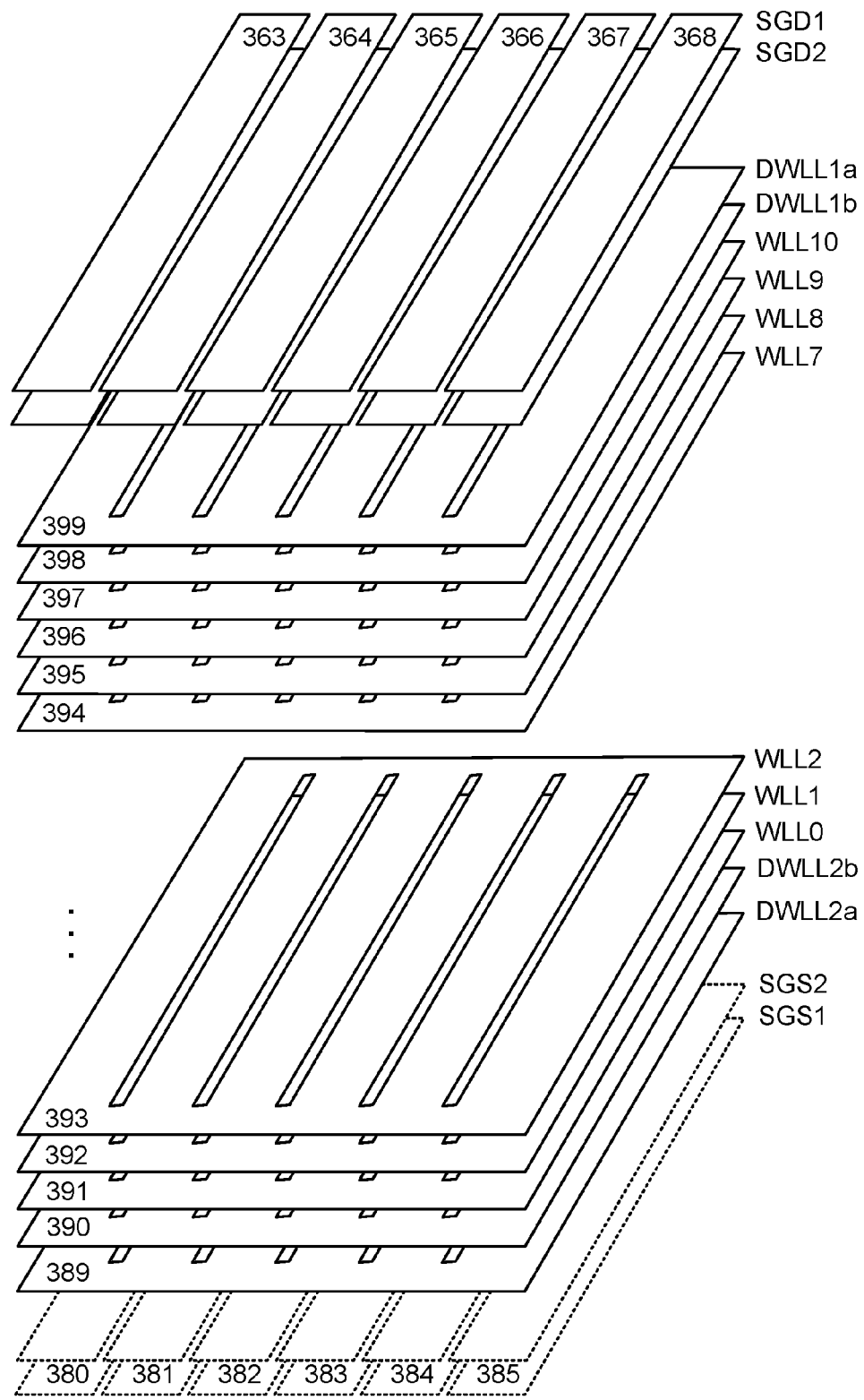
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL1a, DWLL1b, WLL10, WLL9, WLL8 and WLL7 represent word lines 399, 398, 397, 396, 395 and 394, respectively. WLL2, WLL1, WLL0, DWLL2b and DWLL2a represent word lines 393, 392, 391, 390 and 389, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a top view of an example word line layer 400 of the block BLK0 of FIG. 1A, in another straight NAND string embodiment. This approach provides rows of memory holes in a staggered pattern to increase the density of the memory holes. The word line layer is divided into regions 406, 407, 408 and 409 which are each connected by a connector 413. The connector, in turn, is connected to a voltage driver for the word line layer. The region 406 has example memory holes 410 and 411 along a line 412. See also FIG. 4C. Metal-filled slits 401, 402, 403, 404 and 405 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. The metal-filled slits may be provided from the slits which are used during the fabrication, prior to being filled with metal, for tasks such as removing sacrificial material of the control gate layers.

Figure 4B:
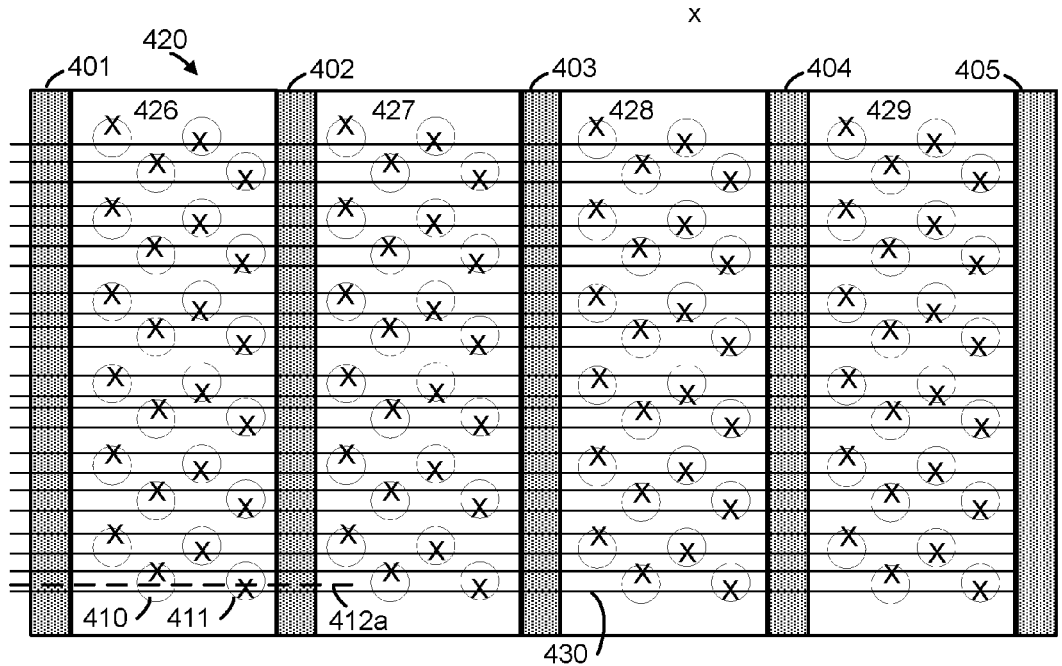
FIG. 4B depicts a top view of an example SGD layer 420, consistent with FIG. 4A.

FIG. 4B depicts a top view of an example SGD layer 420, consistent with FIG. 4A. The SGD layer is divided into regions 426, 427, 428 and 429. Each region can be connected to a respective voltage driver. The region 426 has the example memory holes 410 and 411 along a line 412a. See also FIG. 4C. A number of bit lines extend above the memory holes and are connected to the memory holes as indicated by the "X" symbols. An example bit line 430 is connected to a set of memory holes which includes the memory hole 411. The metal-filled slits 401, 402, 403, 404 and 405 from FIG. 4A are also depicted, as they extend vertically through the stack.

Figure 4C:
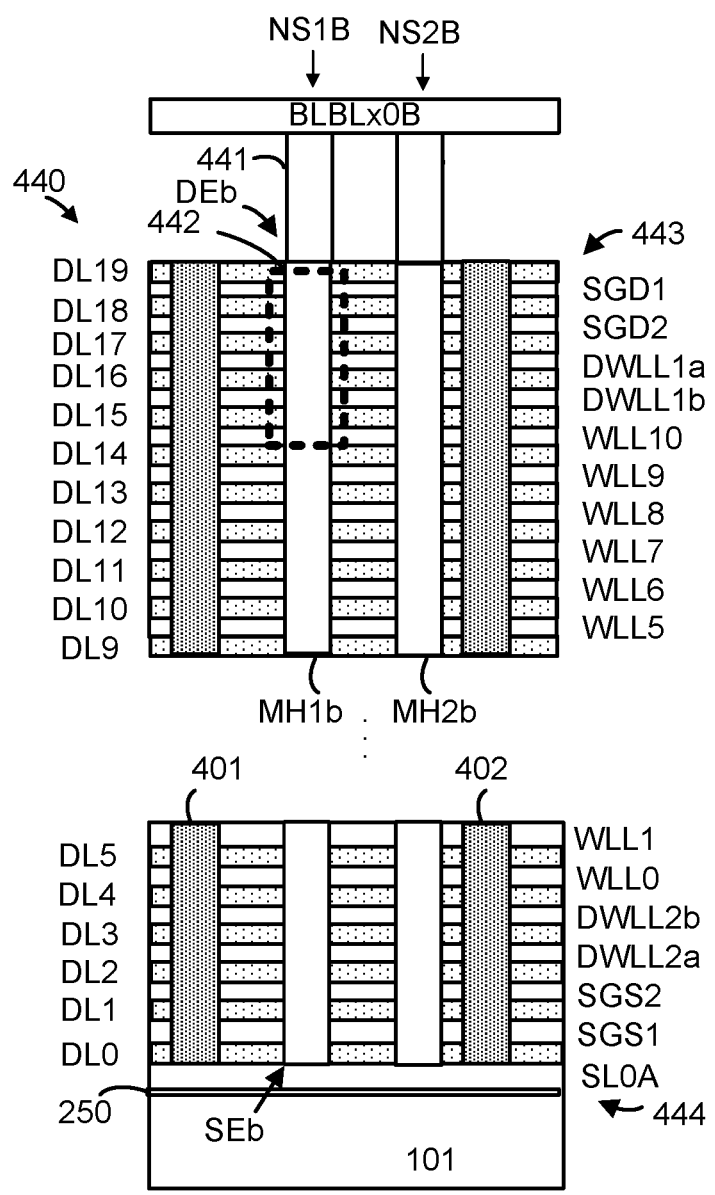
FIG. 4C depicts an embodiment of a stack 440 showing a cross-sectional view along line 412 of FIG. 4A and line 412a of FIG. 4B.

FIG. 4C depicts an embodiment of a stack 440 showing a cross-sectional view along line 412 of FIG. 4A and line 412a of FIG. 4B. Two SGD layers, two SGS layers and four dummy word line layers DWLL1a, DWLL1b, DWLL2a and DWLL2b are provided. Columns of memory cells corresponding to NAND strings NS1B and NS2B are depicted in the multi-layer stack. The stack includes a substrate 101, an insulating film 250 on the substrate, and a portion of a source line SL0A. NS1B has a source end SEb at a bottom 444 of the stack and a drain end Deb at a top 443 of the stack. The metal-filled slits 401 and 402 from FIGS. 4A and 4B are also depicted. A portion of the bit line BLx is also depicted. A conductive via 441 connects DEb to BLx. A region 442 of the stack is shown in greater detail in FIGS. 4E and 4F.

Figure 4D:
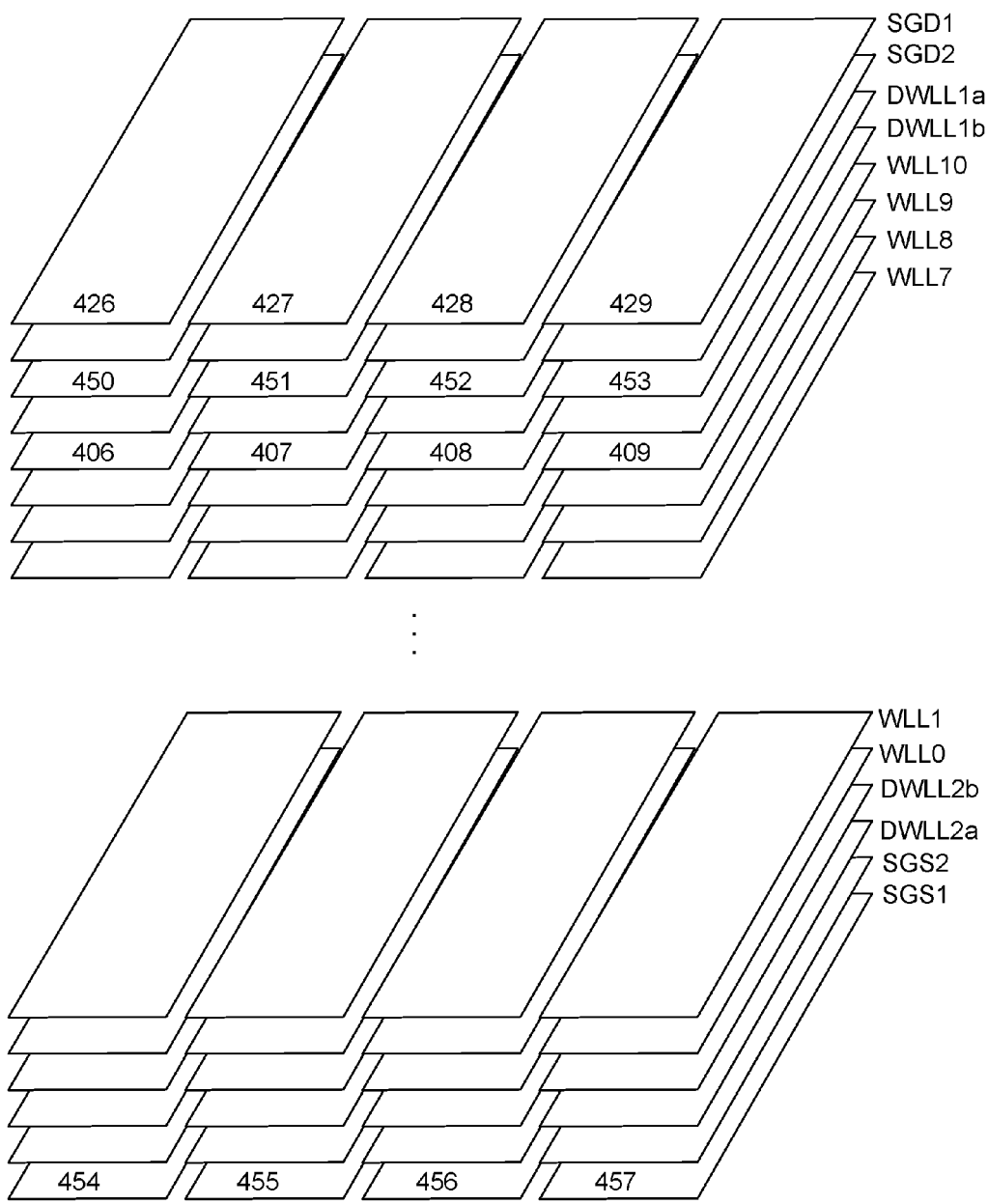
FIG. 4D depicts an alternative view of the select gate layers and word line layers of the stack 440 of FIG. 4C.

FIG. 4D depicts an alternative view of the select gate layers and word line layers of the stack 440 of FIG. 4C. The SGD layers SGD1 and SGD2 each includes parallel rows of select gate lines associated with the drain-side of a set of NAND strings. For example, SGD1 includes drain-side select gate regions 426, 427, 428 and 429 consistent with FIG. 4B. Each select gate line can be independently controlled, in one approach.

Below the SGD layers are the drain-side dummy word line layers. Each dummy word line layer represents a word line, in one approach, and is connected to a set of dummy memory cells at a given height in the stack. For example, DWLL1a comprises word line layer portions 450, 451, 452 and 453.

Below the dummy word line layers are the data word line layers. For example, WLL10 comprises word line layer portions 406, 407, 408 and 409.

Below the data word line layers are the source-side dummy word line layers.

Below the source-side dummy word line layers are the SGS layers. The SGS layers SGS1 and SGS2 each includes parallel rows of select gate lines associated with the source-side of a set of NAND strings. For example, SGS1 includes source-side select gate lines 454, 455, 456 and 457. Each select gate line can be independently controlled, in one approach. Or, the select gate lines can be connected and commonly controlled.

Figure 4E:
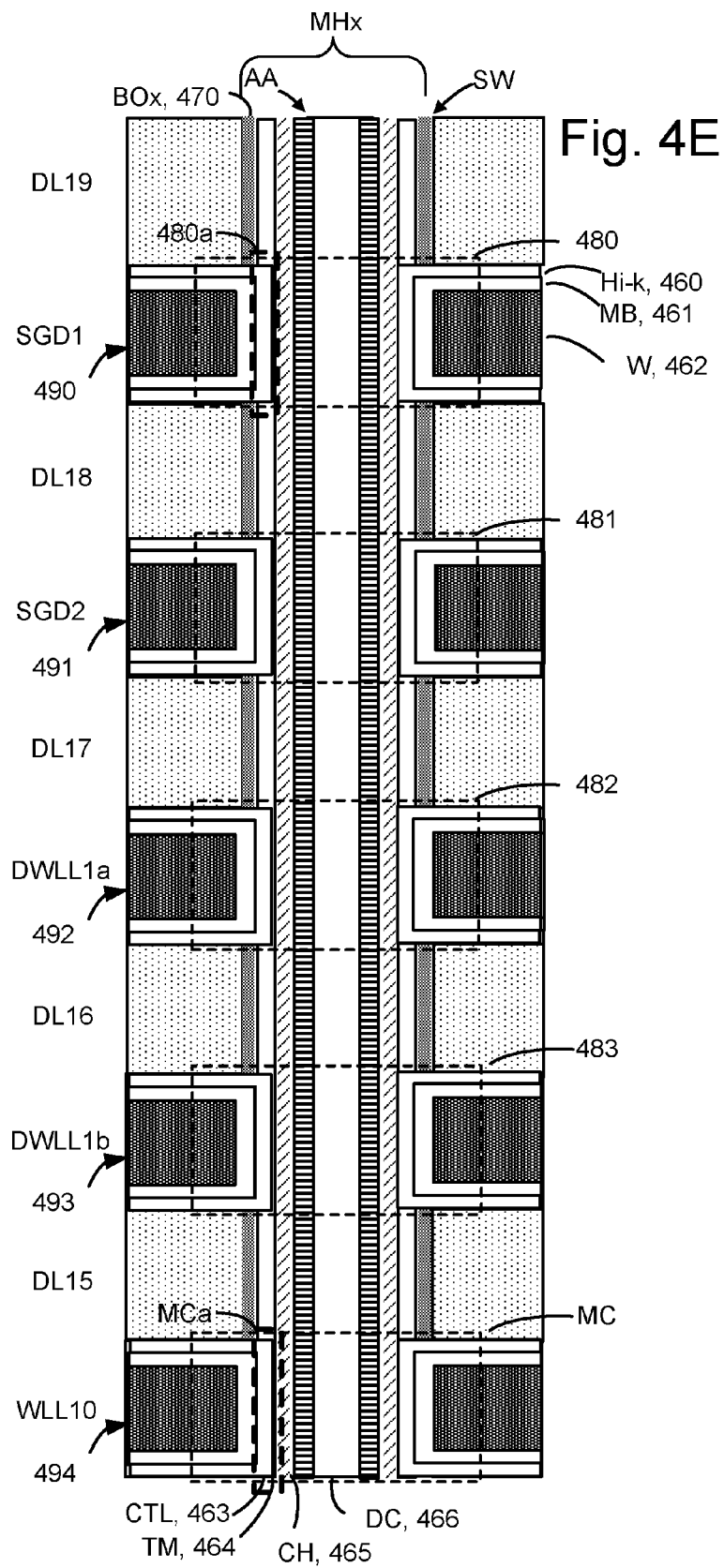
FIG. 4E depicts a view of the region 246 of FIG. 3C or the region 442 of FIG. 4C1, where a blocking oxide layer is provided along the sidewall of the memory hole.

FIG. 4E depicts a view of the region 246 of FIG. 3C or the region 442 of FIG. 4C1, where a blocking oxide layer is provided along the sidewall of the memory hole. SGD transistors 480 and 481 are provided above dummy memory cells 482 and 483 and a data memory cell MC. A number of layers can be deposited along the sidewalls (SW) of the memory hole (MHx) and/or within each word line layer, e.g., using atomic layer deposition. For example, each column (e.g., the pillar which is formed by the materials within a memory hole) can include a charge-trapping layer or film (CTL) 463 such as SiN or other nitride, a tunneling material (TM) 464, a polysilicon body or channel (CH) 465, and a dielectric core (DC) 466. A word line layer can include a blocking oxide (BOx) 470, a block high-k material 460, a metal barrier (MB) 461, and a conductive metal such as W 462 as a control gate. For example, control gates 490, 491, 492, 493 and 494 are provided. In another approach, all of these layers except the metal are provided in the memory hole. Additional pillars are similarly formed in the different memory holes. A pillar can form a columnar active area (AA) of a NAND string.

When a memory cell is programmed, electrons are stored in a portion of the CTL which is associated with the memory cell. These electrons are drawn into the CTL from the channel, and through the tunneling material (TM). The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling material and a channel layer. A core region of each of the memory holes is filled with a body material, and the plurality of annular layers are between the core region and the WLLs in each of the memory holes.

In some cases, the tunneling material 464 can comprise multiple layers such as in an oxide-nitride-oxide configuration.

In this example, the charge-trapping material has been removed from the SGD transistors 480 and 481 and from the dummy memory cells 482 and 483, but remains in the data memory cell MC. For example, a region 480a shows where the charge-trapping material of the SGD transistor 480 was removed, and a region MCa shows where the charge-trapping material of the data memory cell MC was removed.

One or more of the control gate layers SGD1, SGD2, DWLL1a and DWLL1b can be considered to be a control gate layer for a first transistor (e.g., an SGD transistor 480 or 481 or a dummy memory cell 482 or 483 above control gate layers (e.g., WLL0-WLL10) for data memory cells (e.g., MC). The first transistor could be a drain-side select gate transistor, a source-side select gate transistor, a drain-side dummy memory cell and/or source-side dummy memory cell.

FIG. 4F depicts a view of the region 246 of FIG. 3C or the region 442 of FIG. 4C1, where a blocking oxide layer is provided within the control gate layers. For example, the BOx layer 471 is provided within SGD1. In this example, the charge-trapping material has been removed from the SGD transistors 480 and 481 and from the dummy memory cells 482 and 483, but remains in the data memory cell MC. For example, a region 480b shows where the charge-trapping material of the SGD transistor 480 was removed, and a region MCb shows where the charge-trapping material of the data memory cell MC remains in the memory device and is not removed. The memory hole is MHy.

Figure 5:
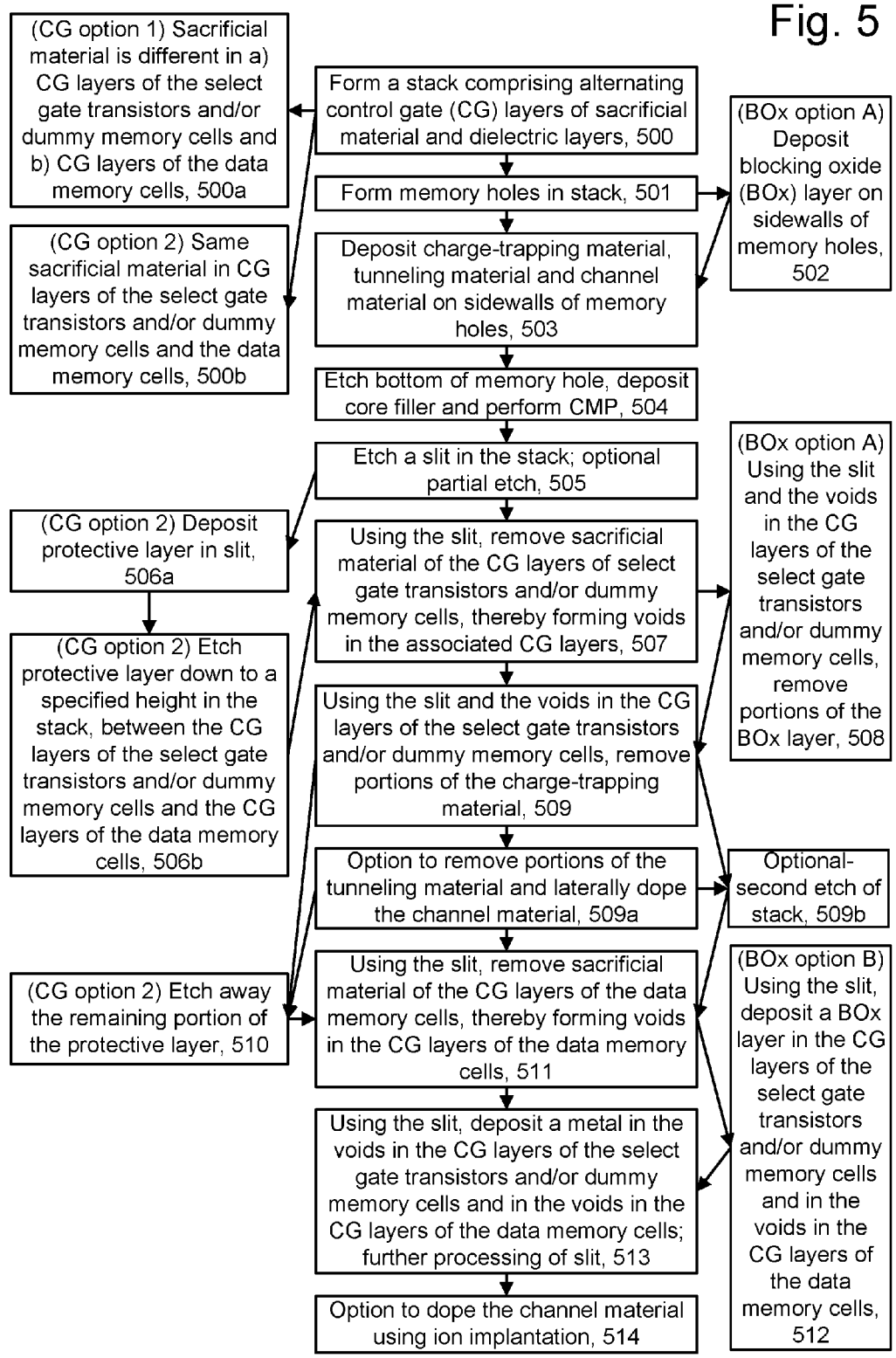
FIG. 5 depicts a fabrication process for a 3D stack in a memory device in which a charge-trapping material is removed from select gate transistors and/or dummy memory cells.

FIG. 4G depicts an overview of the fabrication processes of FIG. 5. The process includes removing a sacrificial material and a charge-trapping material in a second set of control gate layers in a stack, without removing a sacrificial material and a charge-trapping material in a first set of control gate layers in a stack (step 498), followed by removing a sacrificial material without removing a charge-trapping material from the first set of control gate layers in the stack (step 499). This process can be carried out in various implementation. Example implementations are provided in connection with FIG. 5 and the following figures.

FIG. 5 depicts a fabrication process for a 3D stack in a memory device in which a charge-trapping material is removed from select gate transistors and/or dummy memory cells. For conciseness, a number of options in the fabrication process are depicted. Control gate (CG) options involve the composition of the sacrificial material in the different control gate layers of the stack. For instance, CG option 1 or 2 may be used. BOx options involve the location of a blocking oxide layer in the stack. BOx option A and/or B may be used. The steps are illustrated in connection with the following figures.

Step 500 involves forming a stack comprising alternating: a) control gate (CG) layers of sacrificial material and b) dielectric layers. In step 500a (CG option 1), the sacrificial material is different in: a) the CG layers of the select gate transistors and/or the dummy memory cells compared to b) the CG layers of the data memory cells. The different sacrificial materials have different etch rates when subject to an etchant. For example, polysilicon can be used for the CG layers for the select gate transistors and/or the dummy memory cells, and silicon nitride (SiN) can be used for the CG layers for the data memory cells. In step 500b (CG option 2), the sacrificial material can be substantially the same in the CG layers of the select gate transistors, the dummy memory cells and the data memory cells. For example, SiN can be used.

Step 501 involves forming memory holes in the stack. For example, reactive ion etching, a type of dry etching, may be used. In step 502 (BOx option A), a blocking oxide layer is deposited on the sidewalls of the memory holes. Subsequently, step 503 involves depositing a charge-trapping material (e.g., SiN, hafnium oxide, aluminum oxide or other material), a tunneling material (e.g., oxide) and a channel material (e.g., polysilicon) on the sidewalls of the memory holes. Step 504 involves etching through the materials at the bottom of the memory holes to allow the channel material to communicate with the source line, depositing a core filler and performing CMP.

Step 505 involves etching a slit (one or more slits) in the stack. In one approach, the stack is etched from its top to its bottom so that the slit extend the full height of the stack. In another approach, step 505 involves a partial etch of the stack which is followed by a second etch at step 509b. A slit is an example of a void in the stack and can have a trench shape, in one example.

Step 506a (CG option 2) involves depositing a protective layer in the slit and step 506 (CG option 2) involves etching the protective layer down to a specified height in the stack, between the CG layers of the select gate transistors and/or the dummy memory cells and the CG layers of the data memory cells. For example, the height can be between the CG layers of the select gate transistors and/or the dummy memory cells at the drain-side of each NAND string and the CG layers of the data memory cells. An example of a material for the protective layer is oxide. When removing the sacrificial material in the open which are not covered by the protective layer, the oxide can prevent the sacrificial material which is covered by the protective layer from being etched away.

Step 507 involves using the slit to remove sacrificial material of the CG layers of select gate transistors and/or dummy memory cells, thereby forming voids in the CG layers of the select gate transistors and/or dummy memory cells. This step can include providing an etchant in the slit.

Step 508 (BOx option A) involves using the slit and the voids in the CG layers of the select gate transistors and/or dummy memory cells to remove portions of the BOx layer. This step can include providing an etchant in the slit.

Step 509 involves using the slit and the voids in the CG layers of the select gate transistors and/or dummy memory cells to remove portions of the associated charge-trapping material. This step can include providing an etchant in the slit. Once the sacrificial material is removed, a portion of the first layer of material which was deposited along the sidewall of the memory hole is exposed. In some cases, this is the blocking oxide layer. The etch chemistry can be varied during the etching process. For example, an etchant such as diluted hydrofluoric (DHF) acid is suitable for etching oxide, while phosphoric acid is suitable for etching nitride and TMAH is suitable for etching polysilicon. Thus, TMAH can be supplied to remove a polysilicon sacrificial layer, then DHF acid can be supplied to remove a blocking oxide material, then phosphoric acid can be supplied to remove a nitride charge-trapping material. The blocking oxide layer can be relatively thin, and can act as an etch stop to the lateral etching of the polysilicon sacrificial material. If the tunneling material (e.g., oxide) is also to be removed, such as to access the channel material for lateral doping, DHF acid can be supplied again via the slit in the etching process.

The etchants which are provided in the slit and travel horizontally to etch away the sacrificial material and the charge-trapping material can comprises a chemical dry etchant. That is, vapor phase etching can be used.

With the removal of the charge-trapping material, the select gate transistors and the dummy memory cells become transistors in which the blocking oxide is a gate oxide. These transistors are not charge-storing transistors and do not comprise a charge-storing material.

Step 509a involves an option to remove portions of the tunneling material and laterally dope the channel material, e.g., using a dry gas. A heating step may also be used to active the dopants.

Step 509b involves an option to provide a deeper etch of the slit, to the bottom of the stack. In this case, the etching of the slit at step 505 is a partial etch of the stack, down to a specified height. For example, the specified height can be between a bottommost control gate layer of the control gate layers for the dummy memory cells and/or the select gate transistors and a topmost control gate layer of the control gate layers for the data memory cells. Essentially, the transistors (e.g., select gate transistors and/or dummy memory cells) above the specified height have their charge-trapping material removed and the transistors below the specified height do not have their charge-trapping material removed. The etching of the slit in step 509b can then be an etch from the specified height to a bottom of the stack, through a remaining portion of the stack.

Generally, etching the slits twice is feasible since the slits tend to have a wider cross-section compared to the memory holes, for example. Although, there is an additional expense in terms of a second lithography.

Step 510 (CG option 2) involves etching away the remaining portion of the protective layer.

Step 511 involves using the slit to remove sacrificial material of the CG layers of the data memory cells, thereby forming voids in the CG layers of the data memory cells. For example, phosphoric acid can be supplied to remove the SiN sacrificial material, DHF acid can be supplied to remove a blocking oxide material, then phosphoric acid can be supplied again to remove a nitride charge-trapping material.

When the first sacrificial material is being etched in the control gate layers for the dummy memory cells and/or the select gate transistors, the second sacrificial material in the control gate layers for the data memory cells generally is not significantly etched. This is true because a first etchant is used which is more selective of the first sacrificial material than the second sacrificial material. That is, the first etchant causes a higher etch rate for the first sacrificial material than the second sacrificial material. A second etchant is used to etch the second sacrificial material in the control gate layers for the data memory cells. The second etchant is used which is more selective of the second sacrificial material than the dielectric. Similarly, when the first and second sacrificial materials are being etched, the dielectric layers are not significantly etched.

For example, the first sacrificial material can comprise polysilicon, the second sacrificial material can comprise SiN, the first etchant can comprise tetra methyl ammonium hydroxide (TMAH) and the second etchant can comprise phosphoric acid.

Step 512 (BOx option B) involves using the slit to deposit a BOx layer in the CG layers of the select gate transistors and/or dummy memory cells and in the voids in the CG layers of the data memory cells. Step 513 involves using the slit to deposit a metal in the voids in the CG layers of the select gate transistors and/or dummy memory cells and in the voids in the CG layers of the data memory cells. This deposition typically fills the voids and all or most of the slit with metal. Step 513 also includes further processing of the slit, such as etching away the metal in the slit, depositing an insulating layer on the sidewalls of the slit, etching through the insulating layer at the bottom of the slit and depositing metal in the slit. Further processing includes the formation of structures above the stack including control lines such as bit lines and vias to the control lines.

Step 514 involves an option to dope the channel material using ion implantation from the top of the stack. Example p-type dopants include Boron, Arsenic or Phosphorus which cause the channel material to become n-type and therefore have a higher Vth. A heating step can also be used to activate the implanted dopants. For example, rapid thermal annealing at 900-1000 C for 10-30 seconds may be used. The heating generates vacancies which facilitate the movement of the dopants. The ion implantation can be controlled to provide a desired dopant concentration profile along the channel material.

A further option is to provide a different level of lateral doping for the drain-side select gate transistors compared to the drain-side dummy memory cells. In this case, the techniques described herein can be modified to first expose the channel portions of the drain-side select gate transistors to the slit while the channel portions of the remaining transistors are not exposed to the slit. The drain-side select gate transistors can be laterally doped to a first dopant concentration, for example. The process then exposes the channel portions of the drain-side dummy memory cells to the slit while the channel portions of the remaining transistors are not exposed to the slit. The drain-side dummy memory cells can be laterally doped to a second dopant concentration, for example. The process then removes the sacrificial material of the remaining control gate layers.

In one possible implementation, a first sacrificial material is used for the drain-side select gate transistors, a second sacrificial material is used for the drain-side dummy memory cells and a third sacrificial material is used for the remaining transistors, where each of these sacrificial materials can be selectively etched. The first sacrificial material is etched to remove the associated charge-trapping material and dope the associated channel portions. At another time, the second sacrificial material is etched to remove the associated charge-trapping material and dope the associated channel portions. At another time, the third sacrificial material is etched. For example, the third sacrificial material can be carbon. One option of etchant for carbon is H2SO4 (sulfuric acid):H2O2 (hydrogen peroxide) in a 3:1 ratio. The other sacrificial materials can be polysilicon and SiN as before.

Various examples implementations of the fabrication process are discussed below in connection with FIG. 6A-9B, which are generally consistent with the structure of FIG. 4C.

Figure 6A:
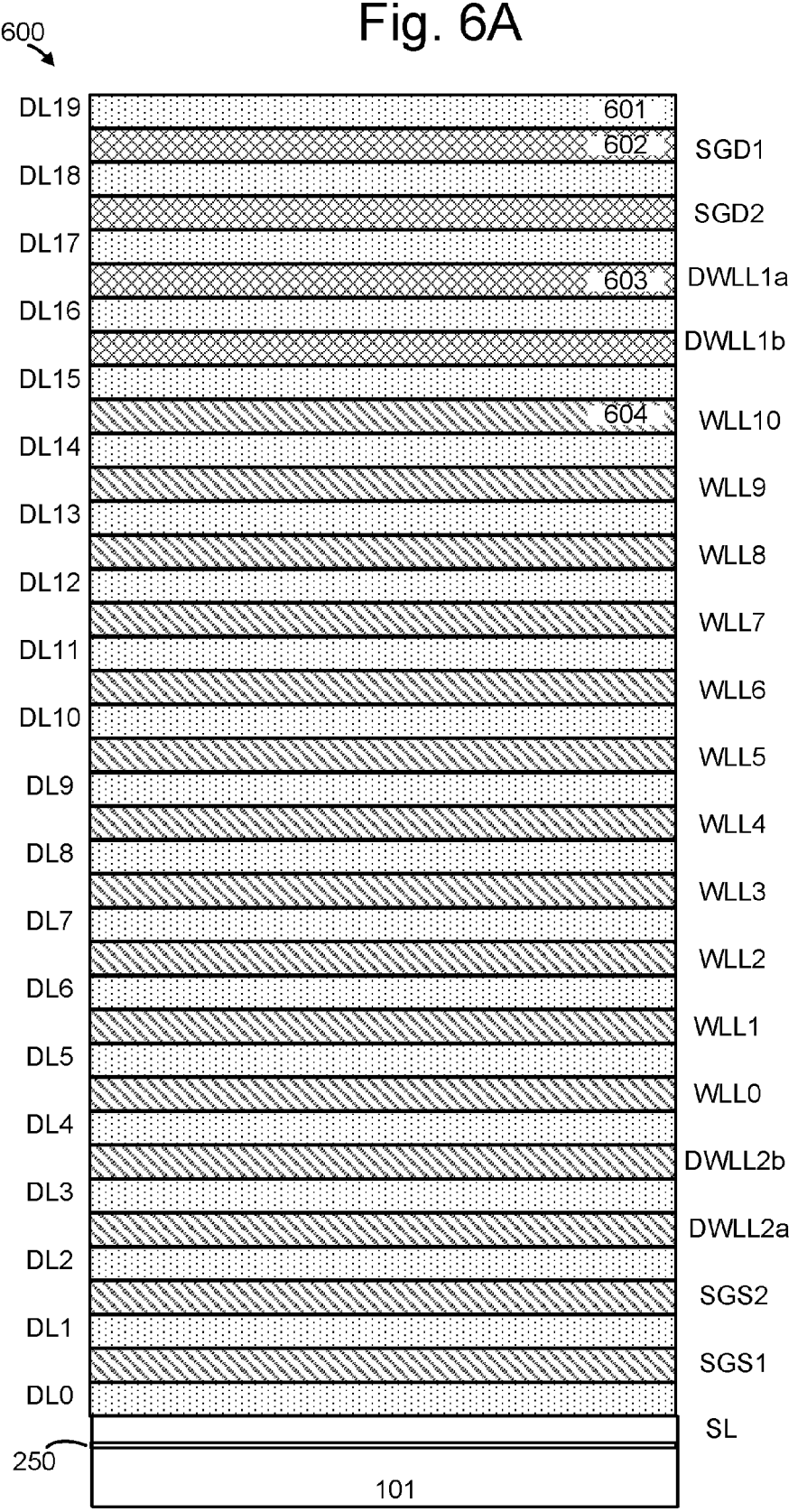
FIG. 6A depicts a semiconductor structure 600 comprising a stack of alternating control gate layers and dielectric layers in accordance with steps 500 and 500a of FIG. 5.

FIG. 6A depicts a semiconductor structure 600 comprising a stack of alternating control gate layers and dielectric layers in accordance with steps 500 and 500a of FIG. 5. An example dielectric material 601 (e.g., oxide) is in DL19. An example first sacrificial material (e.g., polysilicon) is provided in SGD1, SGD2, DWLL1a and DWLL1b. For example, regions 602 and 603 of the first sacrificial material are provided in SGD1 and DWLL1a, respectively. An example second sacrificial material (e.g., SiN) is provided in WLL0-WLL10. For example, a region 604 of the second sacrificial material is provided in WLL10. WLL10 is the topmost CG layer of the CG layers for the data memory cells.

In this example, the second sacrificial material is also provided for the source-side select gate layers and dummy memory cell layers. Generally, it is acceptable to leave in the charge-trapping layer for these layers since the transistors of the drain-side layers tend to be more important in the operation of the NAND string. Moreover, the transistors of the source-side layers are less susceptible to having their Vth increased. Alternatively, it is possible to provide the first sacrificial material for the drain-side layers as well (see FIG. 6B) to allow subsequent removal of the charge-trapping layer for these layers as well.

FIG. 6B depicts a semiconductor structure 605 comprising a stack of alternating control gate layers and dielectric layers in accordance with steps 500 and 500a of FIG. 5, in an option where source-side control gate layers also have a different sacrificial material than the control gate layers of the data memory cells. This is a modification of the semiconductor structure of FIG. 6A. The example first sacrificial material (e.g., polysilicon) is also provided in SGS1, SGS2, DWLL2a and DWLL2b. For example, regions 609 and 606 of the first sacrificial material are provided in SGS1 and DWLL2a, respectively. A region 607 of the second sacrificial material is provided in WLL0. WLL0 is the bottommost CG layer of the CG layers for the data memory cells.

Figure 6C:
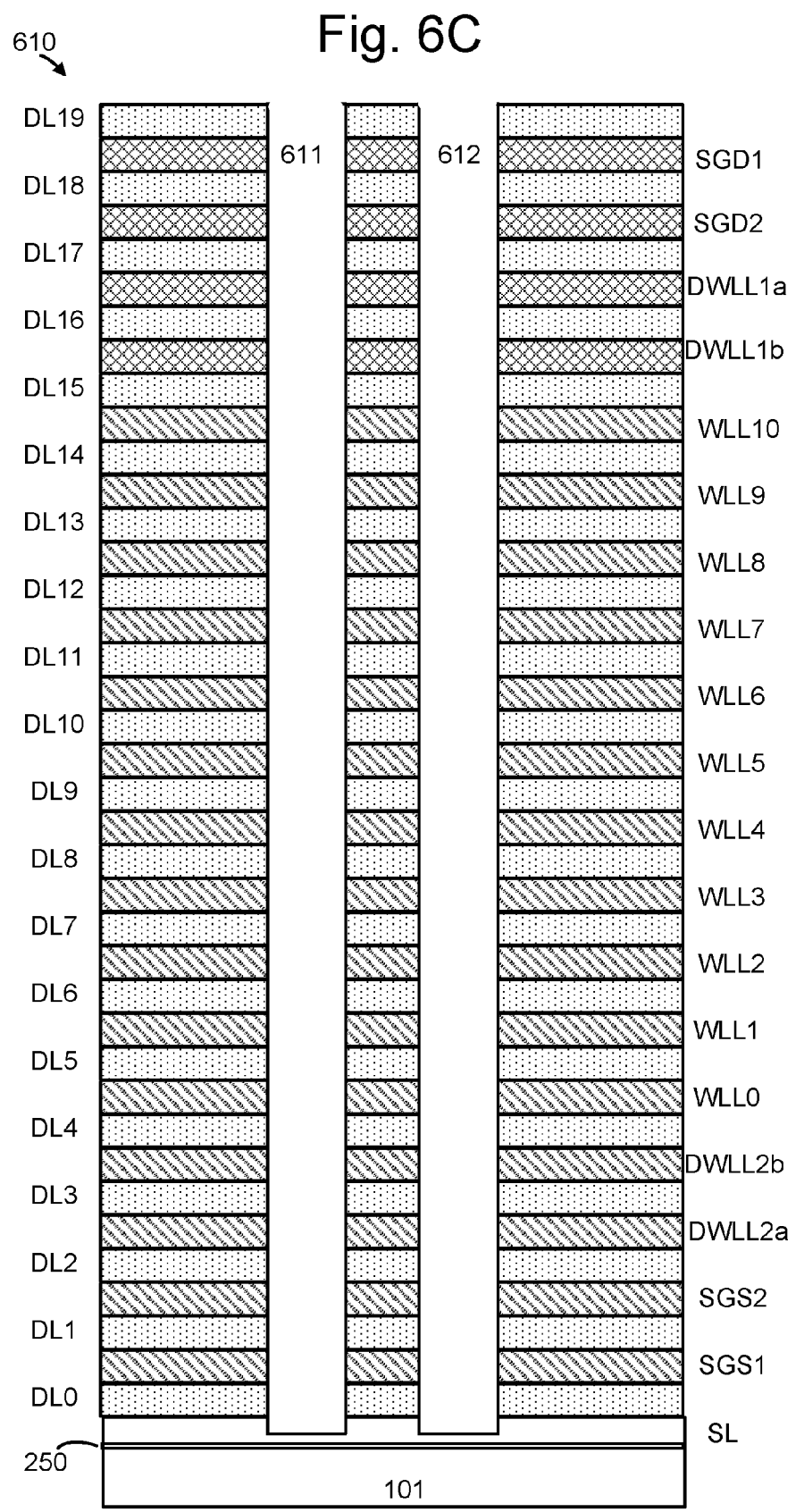
FIG. 6C depicts a semiconductor structure 610 obtained by processing the semiconductor structure of FIG. 6A in accordance with step 501 of FIG. 5.

FIG. 6C depicts a semiconductor structure 610 obtained by processing the semiconductor structure of FIG. 6A in accordance with step 501 of FIG. 5. Memory holes 611 and 612 are etched in this example.

Figure 6D:
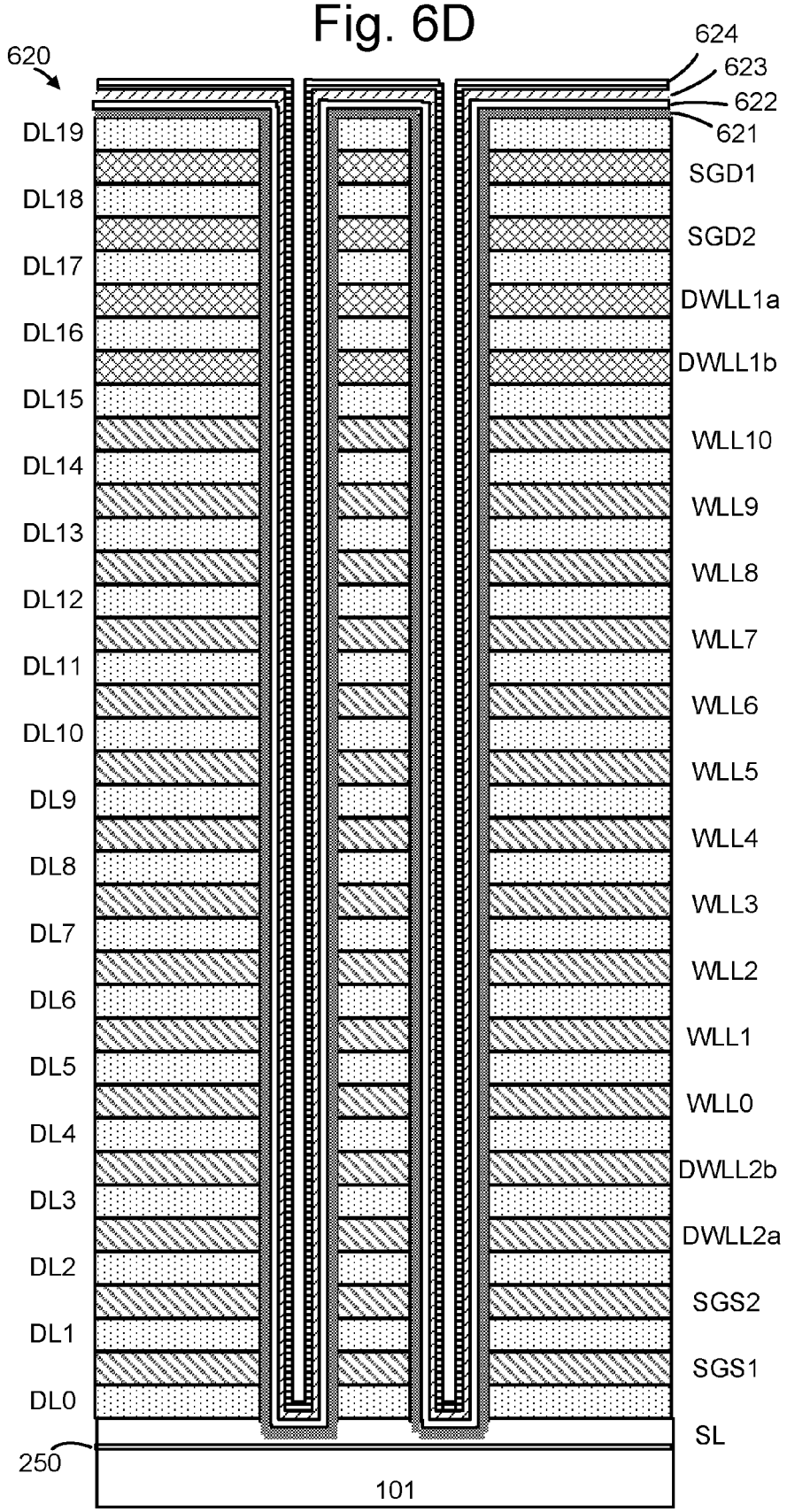
FIG. 6D depicts a semiconductor structure 620 obtained by processing the semiconductor structure of FIG. 6C in accordance with step 503 of FIG. 5.

FIG. 6D depicts a semiconductor structure 620 obtained by processing the semiconductor structure of FIG. 6C in accordance with step 503 of FIG. 5. A number of films are deposited in a blanket deposition, including a blocking oxide layer 621, a charge-trapping material 622, a tunneling oxide layer 623 and a channel material 624.

Figure 6E:
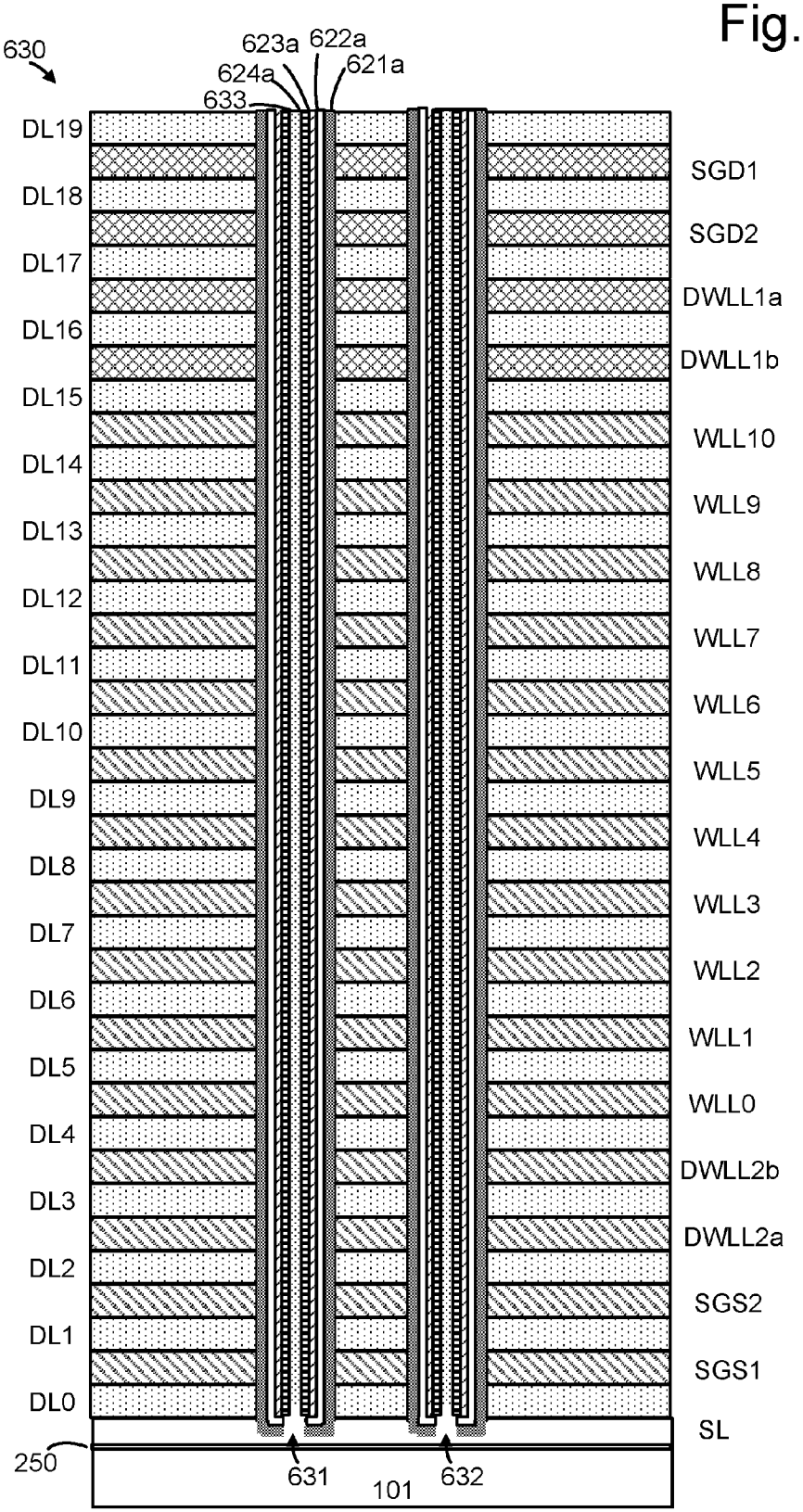
FIG. 6E depicts a semiconductor structure 630 obtained by processing the semiconductor structure of FIG. 6D in accordance with step 504 of FIG. 5.

FIG. 6E depicts a semiconductor structure 630 obtained by processing the semiconductor structure of FIG. 6D in accordance with step 504 of FIG. 5. After openings 631 and 632 are formed at the bottom of the memory holes to allow the channel material to communicate with the source line, a core filler 633 is blanket deposited over the other layers of the semiconductor structure of FIG. 6D. CMP is performed to planarize the top surface of the stack. The remaining portions of the materials along the sidewalls of the memory holes are depicted, including the blocking oxide layer 621a, the charge-trapping material 622a, the tunneling material 623a and the channel material 624a.

In this and other figures, the materials along the sidewalls of a memory holes appear as separate films but are actually part of a single hollow cylinder or tube.

Figure 6F:
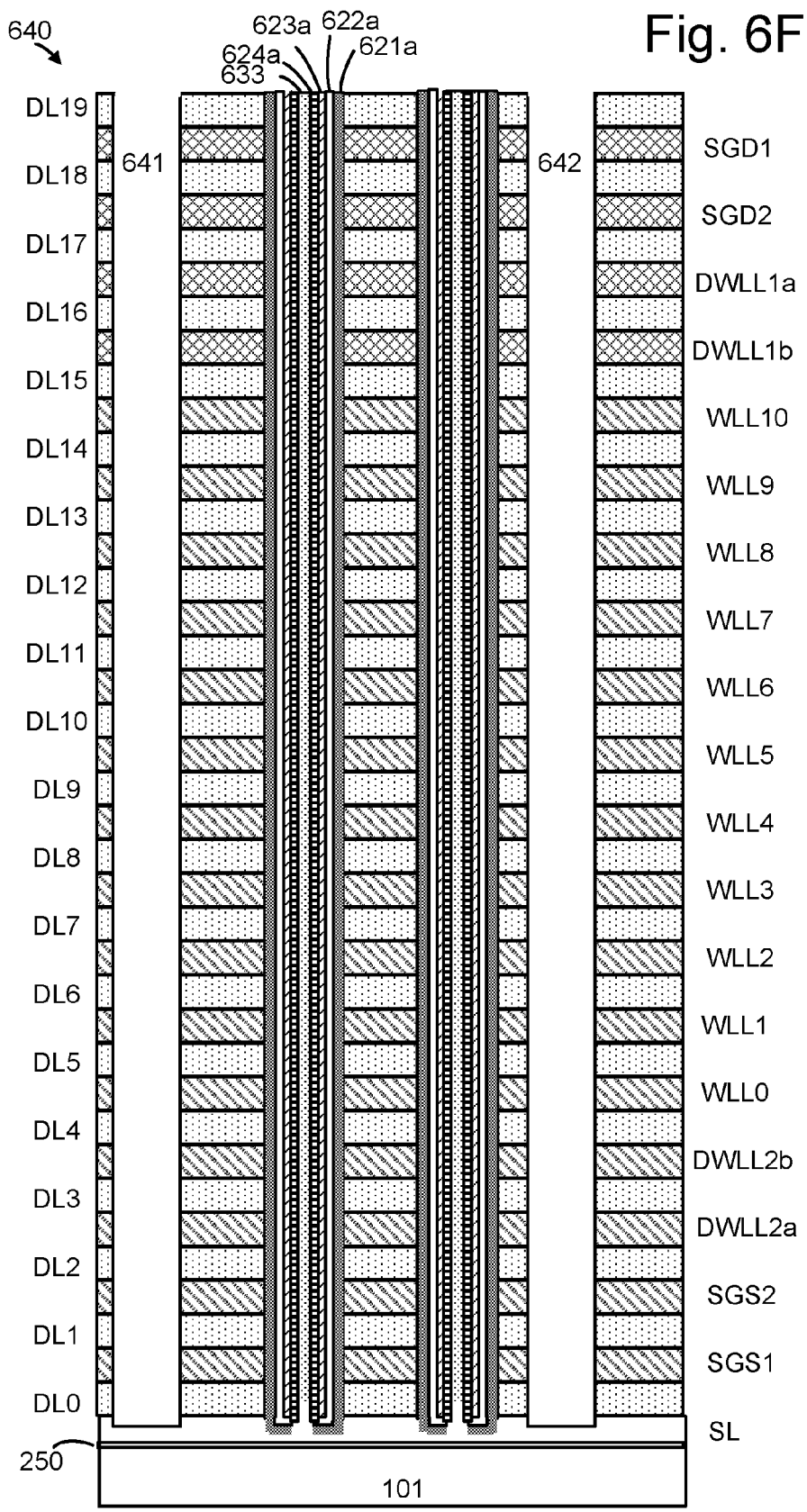
FIG. 6F depicts a semiconductor structure 640 obtained by processing the semiconductor structure of FIG. 6E in accordance with step 505 of FIG. 5.

FIG. 6F depicts a semiconductor structure 640 obtained by processing the semiconductor structure of FIG. 6E in accordance with step 505 of FIG. 5. Slits 641 and 642 are formed. In this and other figures, for conciseness, the width of the slit is depicted as being similar to the width of the memory holes. In practice, the width of the slit is typically larger than the width of the memory holes to facilitate the deposition of etchants and other materials via the slit. Also, note that the use of dummy memory cells is optional, the number of control gate layers can be one or more for the drain-side and source-side select gate transistors and for the dummy memory cells, when used. Further, the height of the different control gate layers can be uniform as depicted or varied.

Figure 6G:
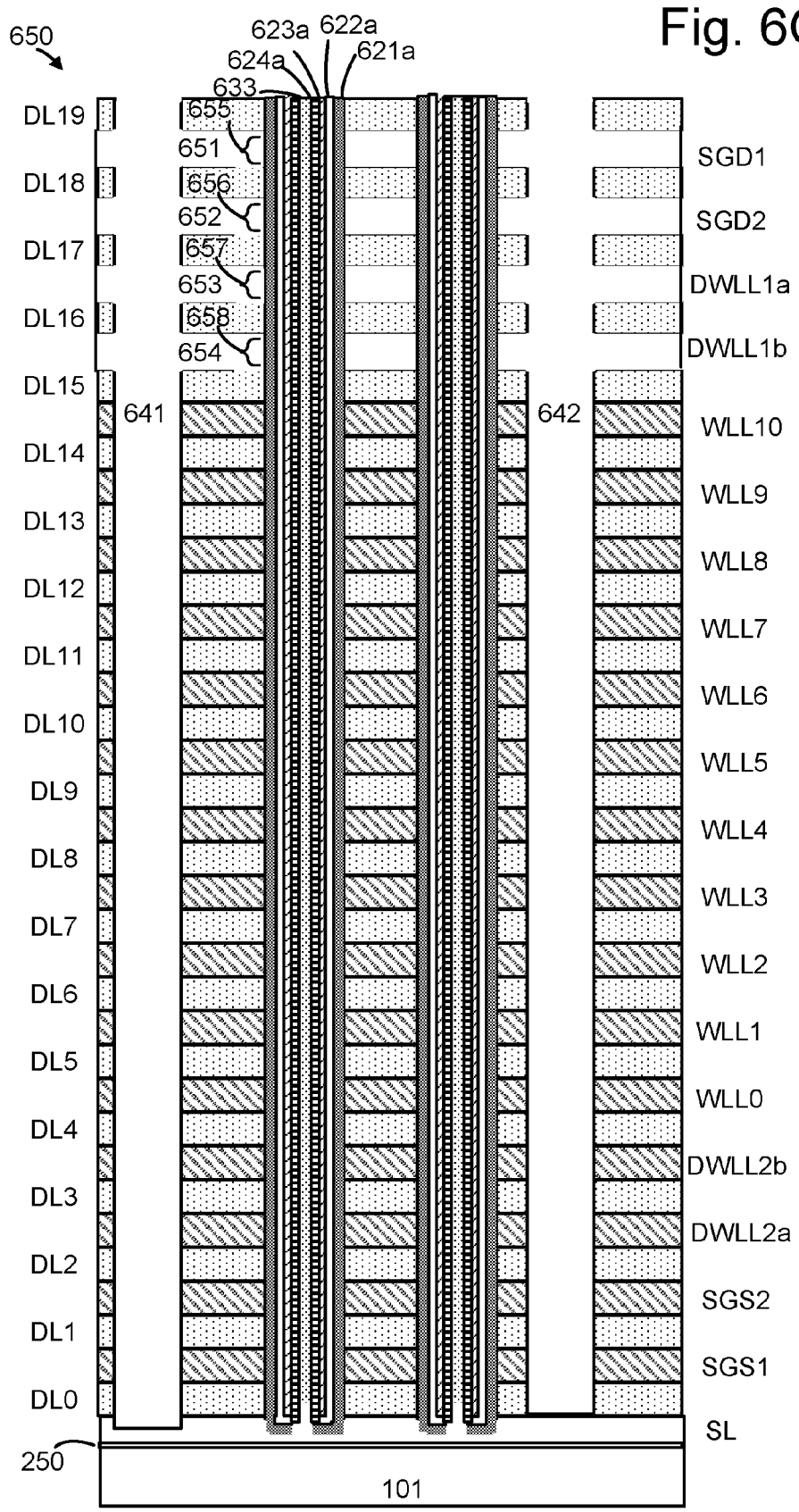
FIG. 6G depicts a semiconductor structure 650 obtained by processing the semiconductor structure of FIG. 6F in accordance with step 507 of FIG. 5, in an option in which the sacrificial material is removed for the drain-side select gate layers and dummy memory cells.

FIG. 6G depicts a semiconductor structure 650 obtained by processing the semiconductor structure of FIG. 6F in accordance with step 507 of FIG. 5, in an option in which the sacrificial material is removed for the drain-side select gate layers and dummy memory cells. Voids 651, 652, 653 and 654 are formed in SGD1, SGD2, DWLL1a and DWLL1b, respectively. Exposed portions 655, 656, 657 and 658 of the blocking oxide layer 621a are also depicted. In this configuration, the sacrificial material is removed for the drain-side select gate layers and the drain-side dummy memory cells. The sacrificial material is not substantially removed for the source-side select gate layers, source-side dummy memory cells and data memory cells.

FIG. 6H1 depicts a semiconductor structure 659 which is an alternative to the semiconductor structure of FIG. 6G, in an option in which the sacrificial material is also removed for the source-side select gate layers and dummy memory cells, consistent with the semiconductor structure of FIG. 6B. Voids 651a, 652a, 653a and 654a are formed in SGS1, SGS2, DWLL2a and DWLL2b, respectively. In this configuration, the sacrificial material is still not substantially removed for the data memory cells. Exposed portions 651b, 652b, 653b and 654b of the blocking material 621a are depicted.

FIG. 6H2 depicts a semiconductor structure 659a obtained by processing the semiconductor structure of FIG. 6H1 in accordance with step 508 of FIG. 5. The etching process continues by removing portions of the blocking material, thereby exposing portions of the charge-trapping material. Exposed portions 651c, 652c, 653c and 654c of the charge-trapping material 622a are depicted. A height of each portion of the blocking material which is removed is the same as the height of the associated control gate layer. Portions of the blocking material which are between the control gate layers, and coincident with the dielectric layers, are not removed in this example.

Figure 6I:
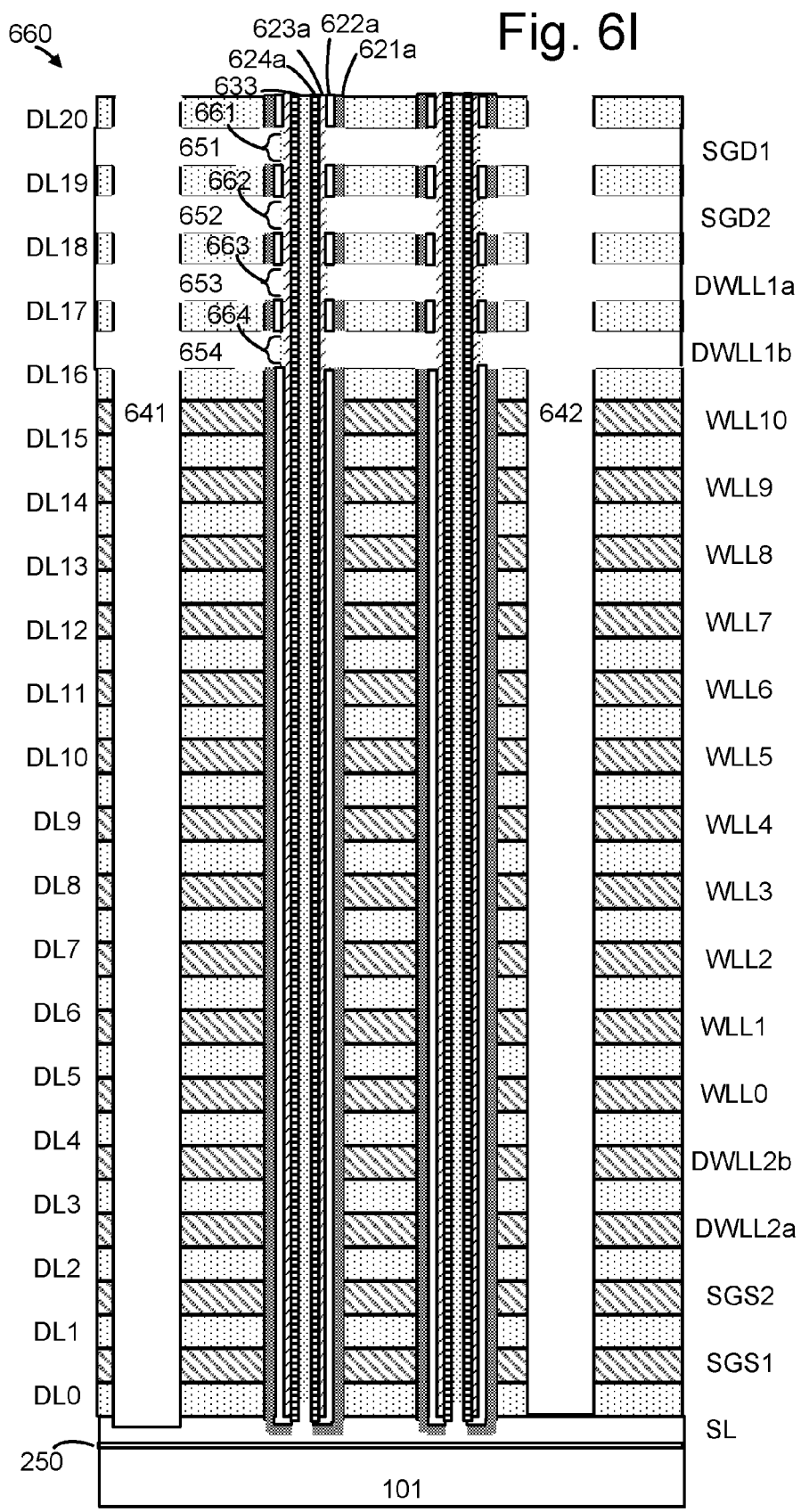
FIG. 6I depicts a semiconductor structure 660 obtained by processing the semiconductor structure of FIG. 6G in accordance with step 508 and 509 of FIG. 5, where the tunneling material remains.

FIG. 6I depicts a semiconductor structure 660 obtained by processing the semiconductor structure of FIG. 6G in accordance with step 508 and 509 of FIG. 5, where the tunneling material remains. The etching process continues by removing portions of the blocking material and the charge-trapping material, thereby exposing portions of the tunneling material. Exposed portions 661, 662, 663 and 664 of the tunneling material 623*a* are depicted. A height of each portion of the blocking material and the charge-trapping material which is removed is the same as the height of the associated control gate layer. Portions of the blocking material and the charge-trapping material which are between the control gate layers, and coincident with the dielectric layers, are not removed in this example.

Figure 6J:
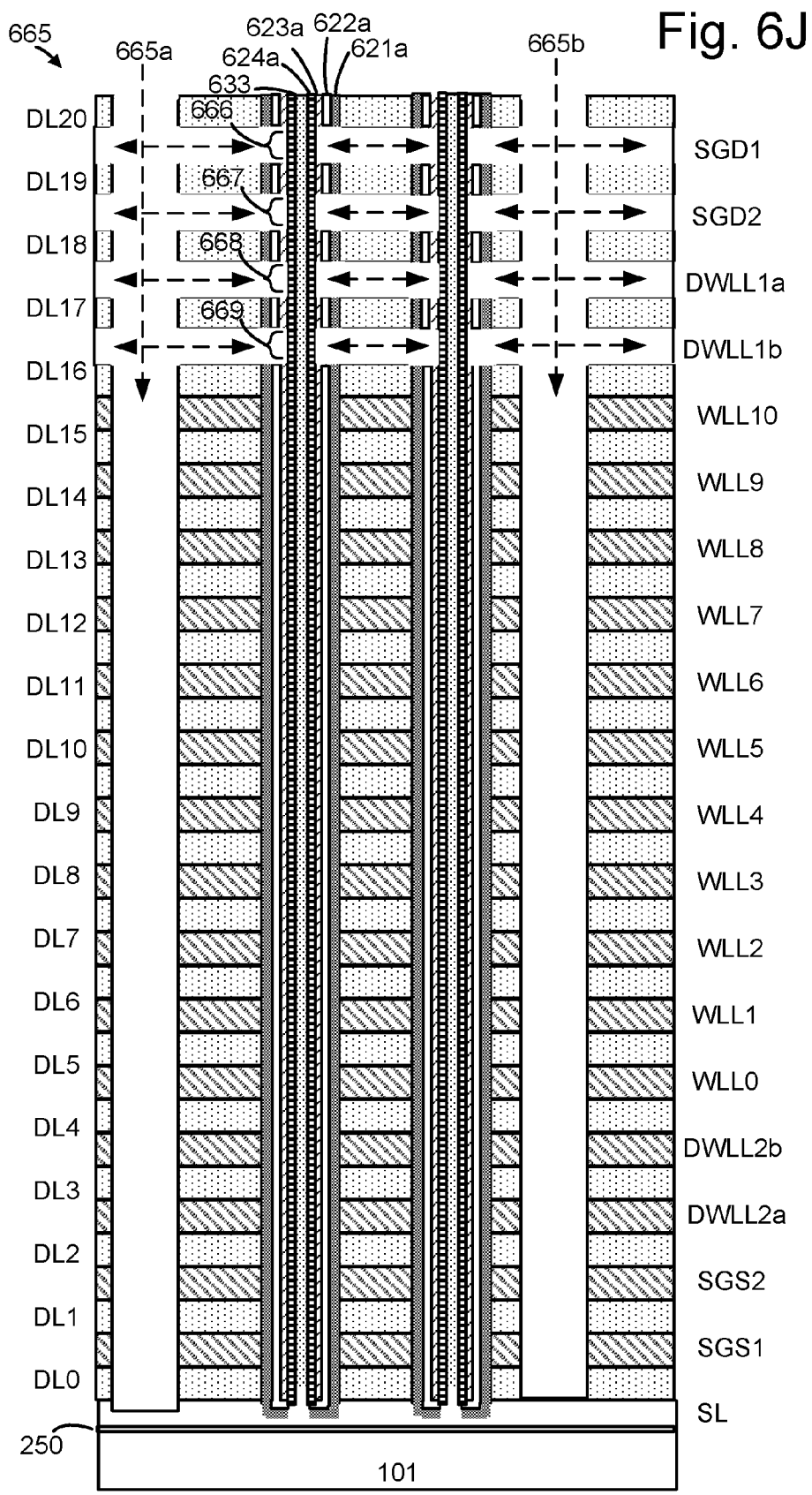
FIG. 6J depicts a semiconductor structure 665 obtained by processing the semiconductor structure of FIG. 6I in accordance with step 509a of FIG. 5, where the tunneling material is etched away and a dopant is introduced laterally to the channel material.

FIG. 6J depicts a semiconductor structure 665 obtained by processing the semiconductor structure of FIG. 6I in accordance with step 509*a* of FIG. 5, where the tunneling material is etched away and a dopant is introduced laterally to the channel material. Exposed portions 666, 667, 668 and 669 of the channel material 624*a* are depicted. A dopant in dry gas form, for instance, flows into the slits and voids to reach the exposed portions of the channel material. The flow is depicted by dashed lines 665*a* and 665*b*. For example, a p-type dopant can be used to increase the Vth of the associated select gate transistors and dummy memory cells. As mentioned in connection with step 514 of FIG. 5, an n-type dopant can be used to decrease the Vth of the associated select gate transistors and dummy memory cells. Typically, it is desirable to increase the Vth rather than decrease it. The Vth of the select gate transistors and dummy memory cells should be high enough (e.g., 2-3 V) so that these transistors are in a non-conductive state when 0 V is applied to their control gates.

Figure 6K:
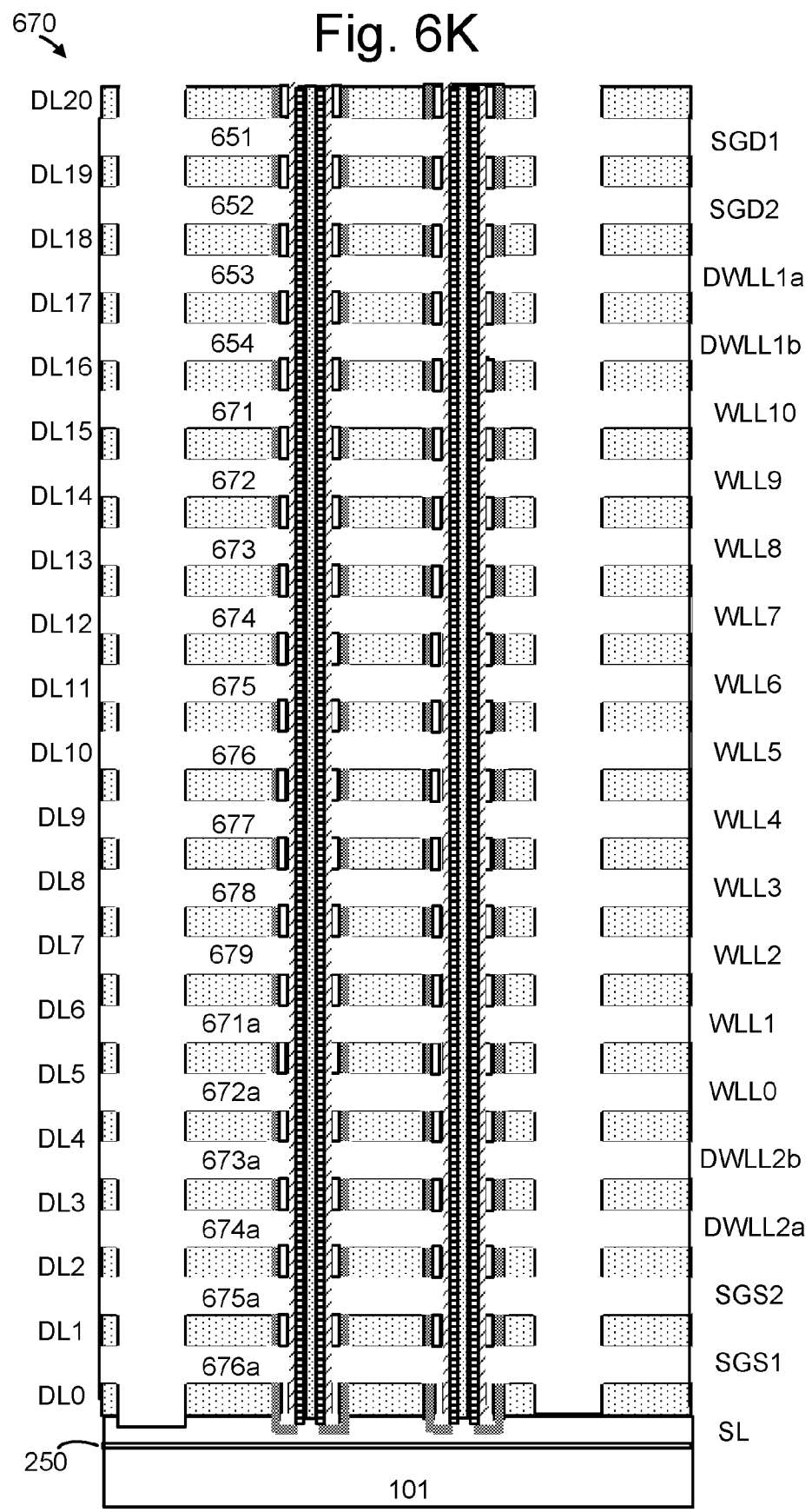
FIG. 6K depicts a semiconductor structure 670 obtained by processing the semiconductor structure of FIG. 6I in accordance with step 511 of FIG. 5.

FIG. 6K depicts a semiconductor structure 670 obtained by processing the semiconductor structure of FIG. 6I in accordance with step 511 of FIG. 5. After the sacrificial material and the charge-trapping material has been removed from the desired layers and any lateral doping has been performed in the channel material, the sacrificial material of the remaining control gate layers can be removed. The remaining control gate layers include SGS1, SGS2, DWLL2*a*, DWLL2*b* and WLL0-WLL10, in this example. Voids are therefore formed in each of the control gates layers. For example, voids 671, 672, 673, 674, 675, 676, 677, 678, 679, 671*a*, 672*a*, 673*a*, 674*a*, 675*a* and 676*a* are formed in WLL10, WLL9, WLL8, WLL7, WLL6, WLL5, WLL4, WLL3, WLL2, WLL1, WLL0, DWLL2*b*, DWLL2*a*, SGS2 and SGS1, respectively. This is in addition to the voids 651, 652, 653 and 654 which are formed in SGD1, SGD2, DWLL1*a* and DWLL1*b*, respectively.

Figure 6L:
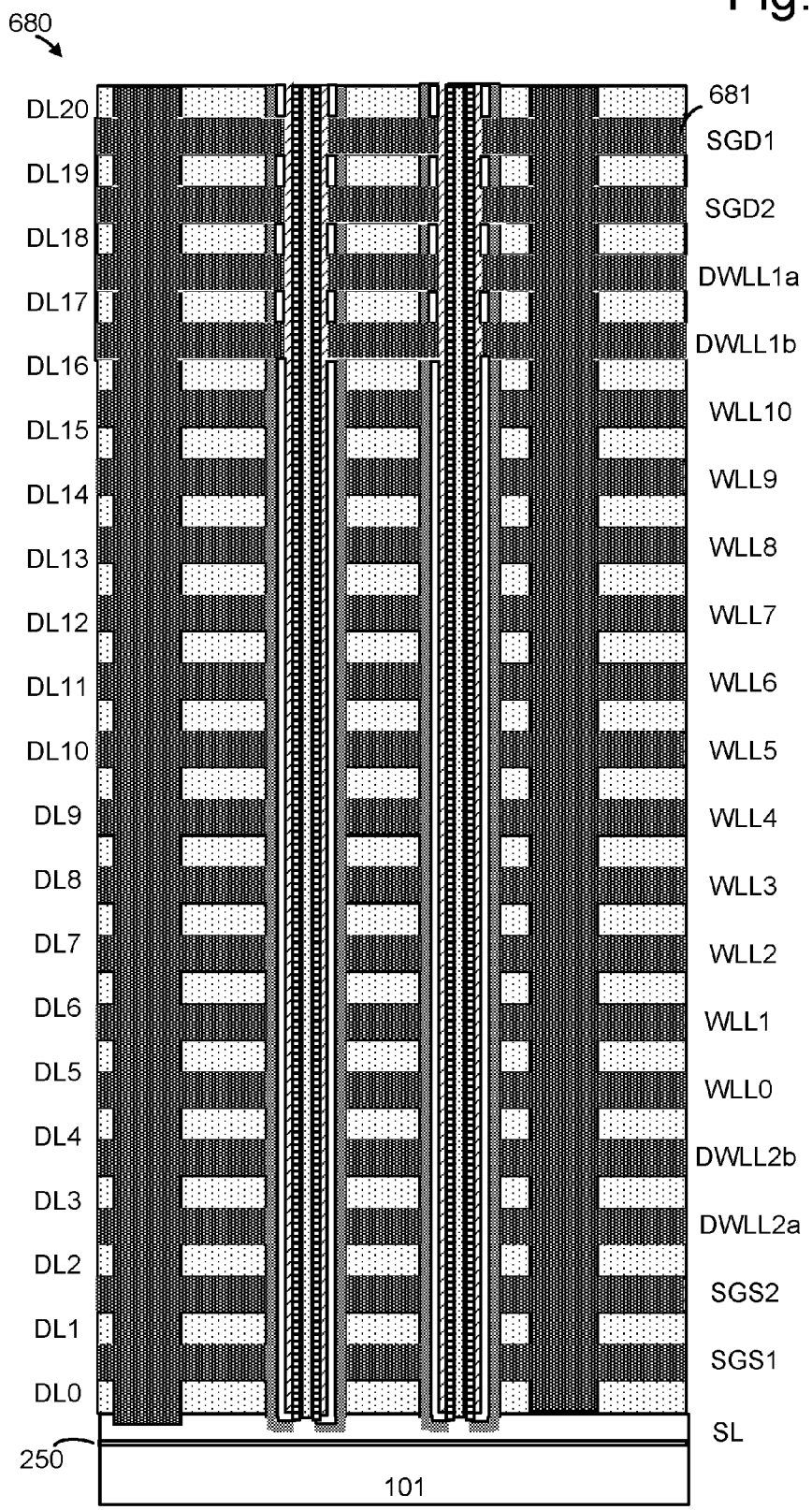
FIG. 6L depicts a semiconductor structure 680 obtained by processing the semiconductor structure of FIG. 6K in accordance with step 513 of FIG. 5, where metal is deposited in the voids and slits.

FIG. 6L depicts a semiconductor structure 680 obtained by processing the semiconductor structure of FIG. 6K in accordance with step 513 of FIG. 5, where metal is deposited in the voids and slits. A metal 681 such as tungsten tends to fill the voids and the slits. Before the metal is deposited, other materials such as a high-k material and a metal barrier layer can be deposited in the voids. In some cases, the width of the slit is greater than the height of the voids and the metal fills the voids but coats the sidewalls of the slits without entirely filling the slits.

Figure 6M:
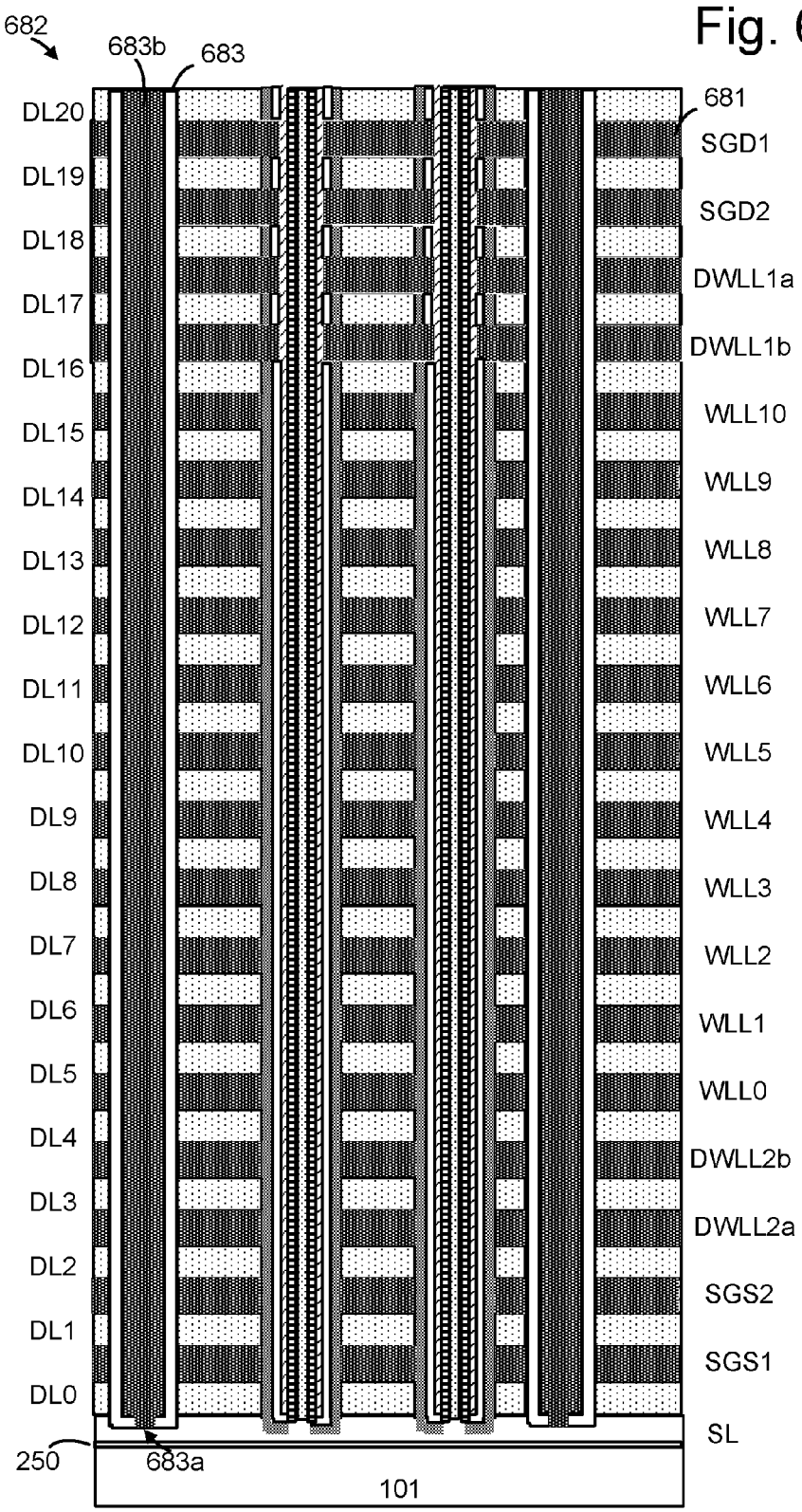
FIG. 6M depicts a semiconductor structure 682 obtained by processing the semiconductor structure of FIG. 6L in accordance with step 513 of FIG. 5, to remove the previously-deposited metal, provide an insulating layer in the slit, etch through the insulating layer at a bottom of the slit, and deposit additional metal to form metal-filled slits.

FIG. 6M depicts a semiconductor structure 682 obtained by processing the semiconductor structure of FIG. 6L in accordance with step 513 of FIG. 5, to remove the previously-deposited metal, provide an insulating layer 683 in the slit, etch through the insulating layer at a bottom 683*a* of the slit, and deposit additional metal 683*b* to form metal-filled slits. The previously-deposited metal in the slits (shown in FIG. 6L) is removed, e.g., by dry etching, to remove a conductive path between the control gate layers which prevents independent driving of the control gate layers. The opening at the bottom of the slit allows the metal in the slit to contact the source line SL to provide a conductive interconnect to the top of the stack. Appropriate masks are used at the top of the stack outside the slit when etching away the previously-deposited metal in the slit, and to deposit the insulating layer and the additional metal in the slit. CMP can be performed to remove excess amounts of the previously-deposited metal, insulating layer, additional metal and mask above the stack to arrive at the structure in this figure. In another approach, an insulating material entirely fills the slit after the previously-deposited metal in the slit is removed. In this case, the slit does not act as a vertical interconnect.

Figure 6N:
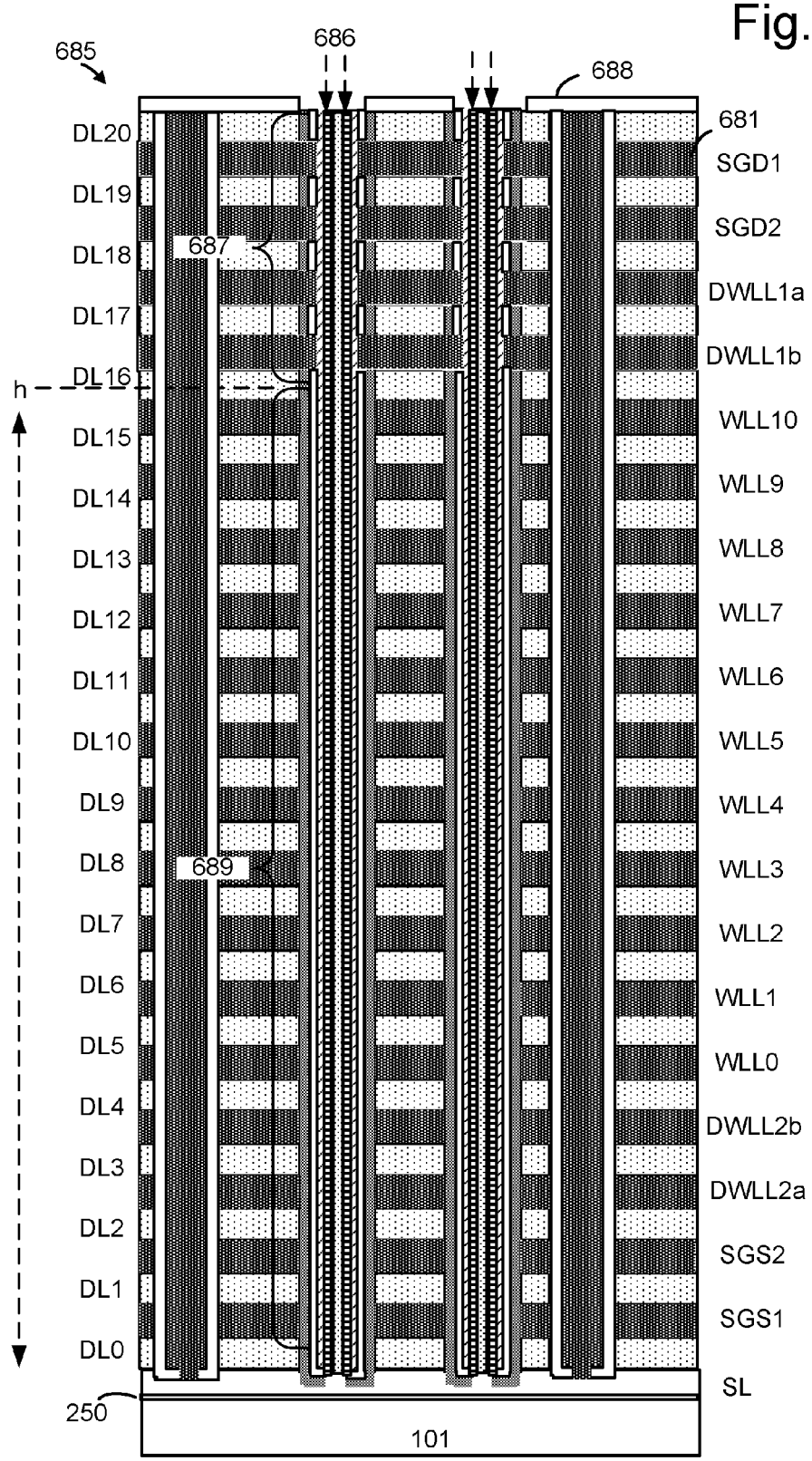
FIG. 6N depicts a semiconductor structure 685 obtained by processing the semiconductor structure of FIG. 6M in accordance with step 514 of FIG. 5.

FIG. 6N depicts a semiconductor structure 685 obtained by processing the semiconductor structure of FIG. 6M in accordance with step 514 of FIG. 5. Dopant can be applied to the top of the stack using ion implantation as depicted by arrows 686. A p-type dopant can be used to increase the Vth of the associated select gate transistors and dummy memory cells and an n-type dopant can be used to decrease the Vth of the associated select gate transistors and dummy memory cells. The energy of the ion implantation and an associated annealing (heating) time and temperature can be controlled so that the ions are implanted to a depth which encompasses the channel material of the control gate layers of the select gate transistors and/or dummy memory cells. In this example, the doping occurs in a portion 687 of the channel material but not in a portion 689 of the channel material. That is, the doping can occur from a top of the stack down to a height h in the stack, in one approach. Optionally, the ion implantation can be controlled such that a doping concentration is different for the select gate transistors compared to the dummy memory cells. The doping concentration could also be different for different select gate transistors and/or for different dummy memory cells. A mask 688 may be used to prevent ion implantation outside the memory hole area, and to limit the ion implantation to the memory hole.

Figure 6O:
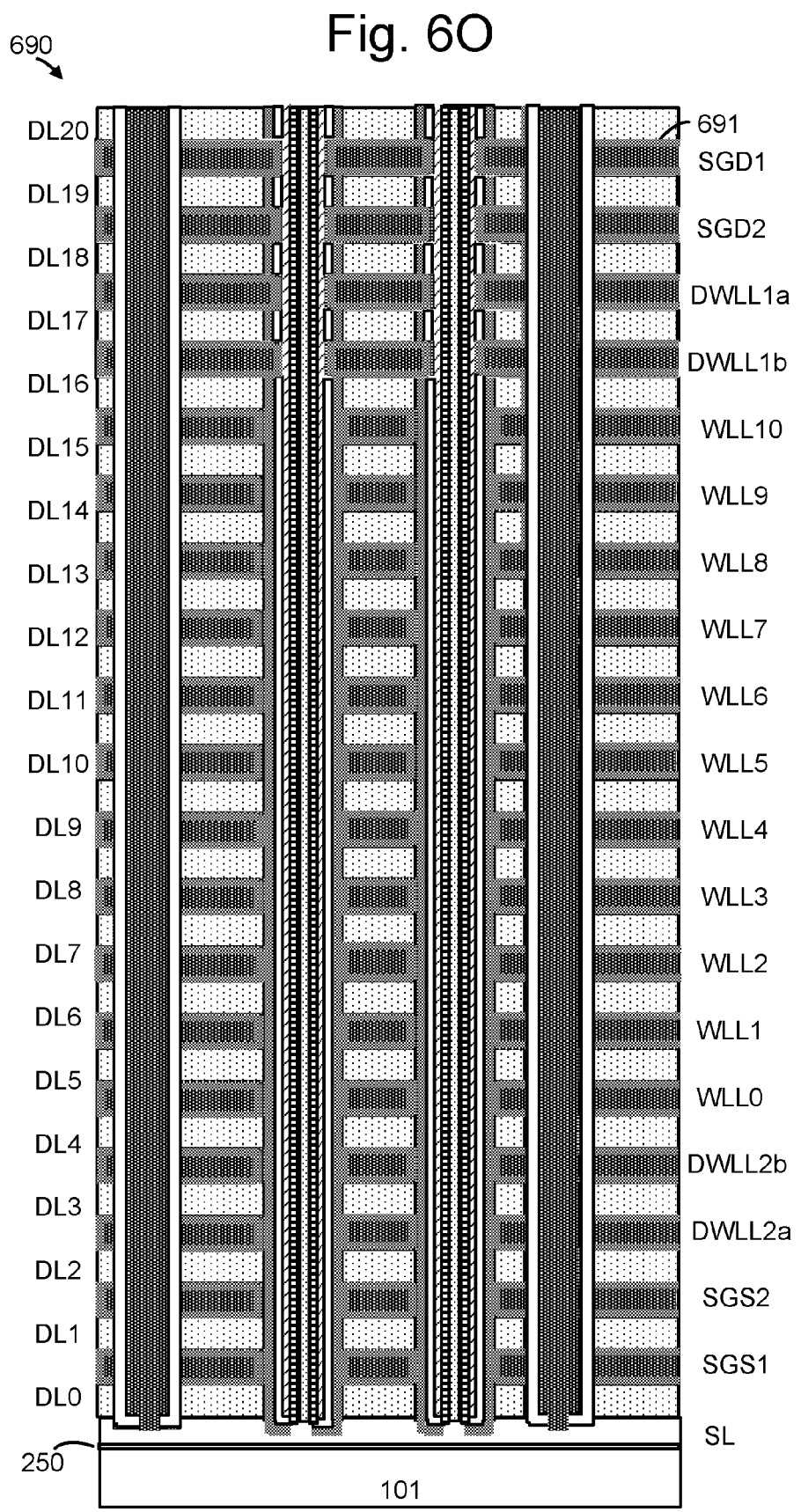
FIG. 6O depicts a semiconductor structure 690 obtained by processing the semiconductor structure of FIG. 6K in accordance with steps 512 and 513 of FIG. 5.

FIG. 6O depicts a semiconductor structure 690 obtained by processing the semiconductor structure of FIG. 6K in accordance with steps 512 and 513 of FIG. 5. In step 512, in particular, a blocking oxide layer 691 can be deposited in the voids of the control gate layers before the metal is deposited. The blocking oxide layer can be provided in the voids when a blocking oxide layer is not provided along the sidewalls of the memory holes. Or, the blocking oxide layer in the voids can be in addition to a blocking oxide layer along the sidewalls of the memory holes. The blocking oxide layer in the voids of the control gate layers of the select gate transistors and/or dummy memory cells ensures that the associated control gate metal does not contact the channel material.

Figure 7A:
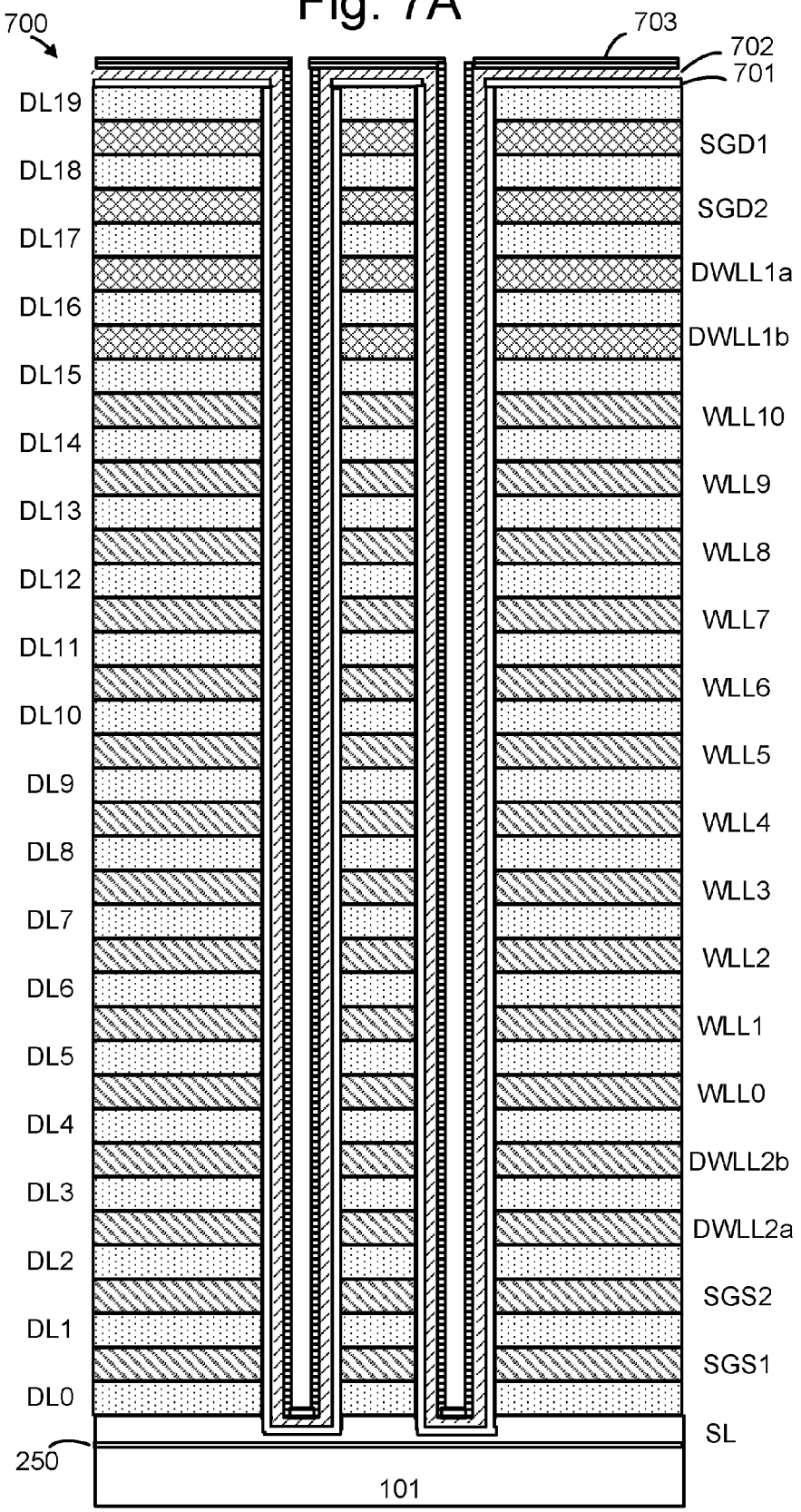
FIG. 7A depicts a semiconductor structure 700 obtained by processing the semiconductor structure of FIG. 6C in accordance with step 503 of FIG. 5.

FIG. 7A depicts a semiconductor structure 700 obtained by processing the semiconductor structure of FIG. 6C in accordance with step 503 of FIG. 5. In this case, the blocking oxide layer is not provided in the memory holes. A charge-trapping material 701 is deposited, followed by a tunneling material 702 and a channel material 703.

Figure 7B:
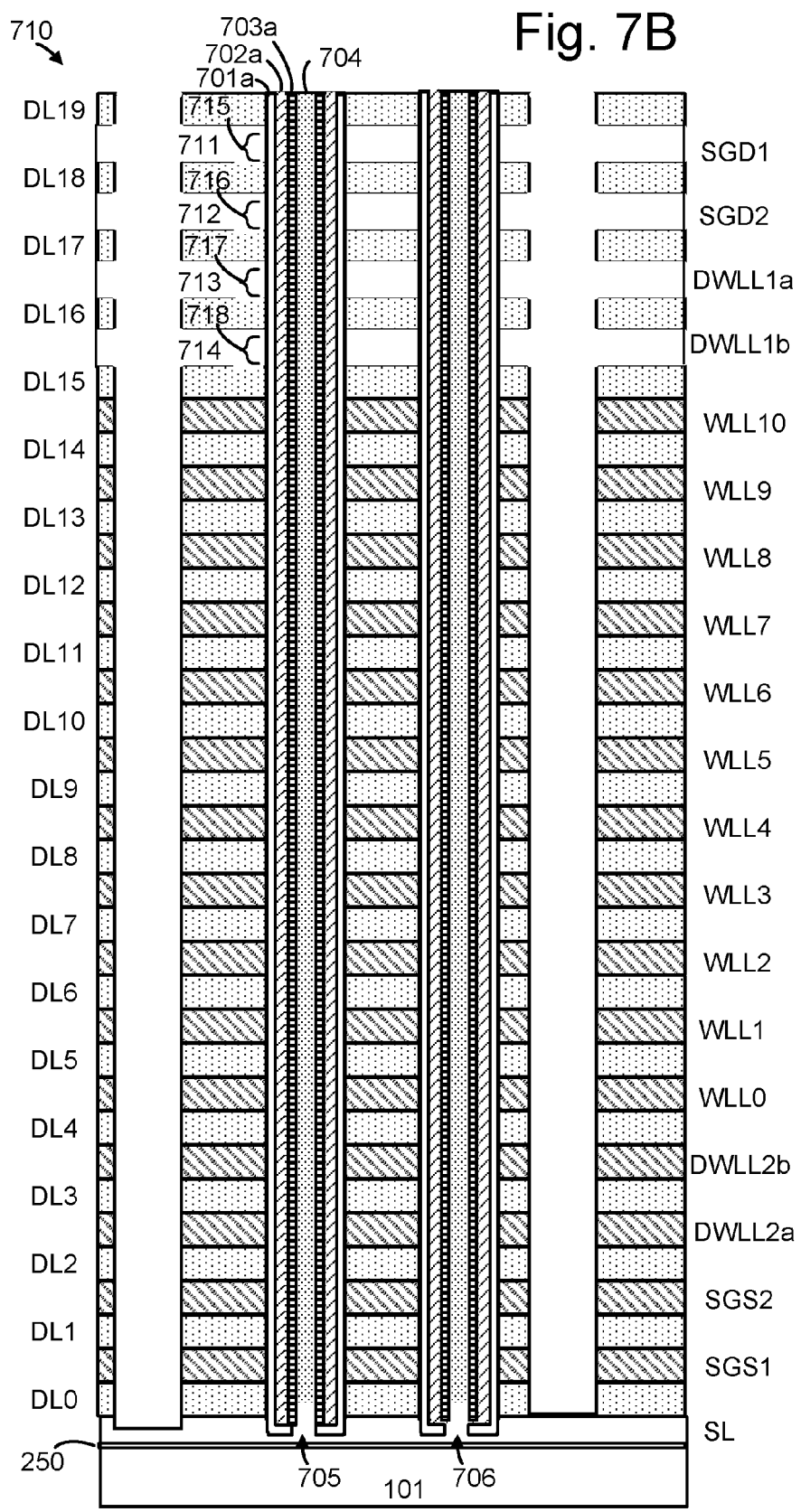
FIG. 7B depicts a semiconductor structure 710 obtained by processing the semiconductor structure of FIG. 7A in accordance with steps 504, 505 and 507 of FIG. 5.

FIG. 7B depicts a semiconductor structure 710 obtained by processing the semiconductor structure of FIG. 7A in accordance with steps 504, 505 and 507 of FIG. 5. After openings 705 and 706 are formed at the bottom of the memory holes to allow the channel material to communicate with the source line, a core filler 704 is blanket deposited over the other layers of FIG. 7A. CMP is performed to planarize the top surface of the stack. The remaining portions of the materials along the sidewalls of the memory holes are depicted, including the charge-trapping material 701*a*, the tunneling material 702*a* and the channel material 703*a*.

Subsequently, the slits are formed, and the sacrificial material is selectively removed so that voids 711, 712, 713 and 714 are formed in SGD1, SGD2, DWLL1*a* and DWLL1*b*, respectively. Exposed portions 715, 716, 717 and 718 of the charge-trapping material 701*a* are also depicted.

Figure 7C:
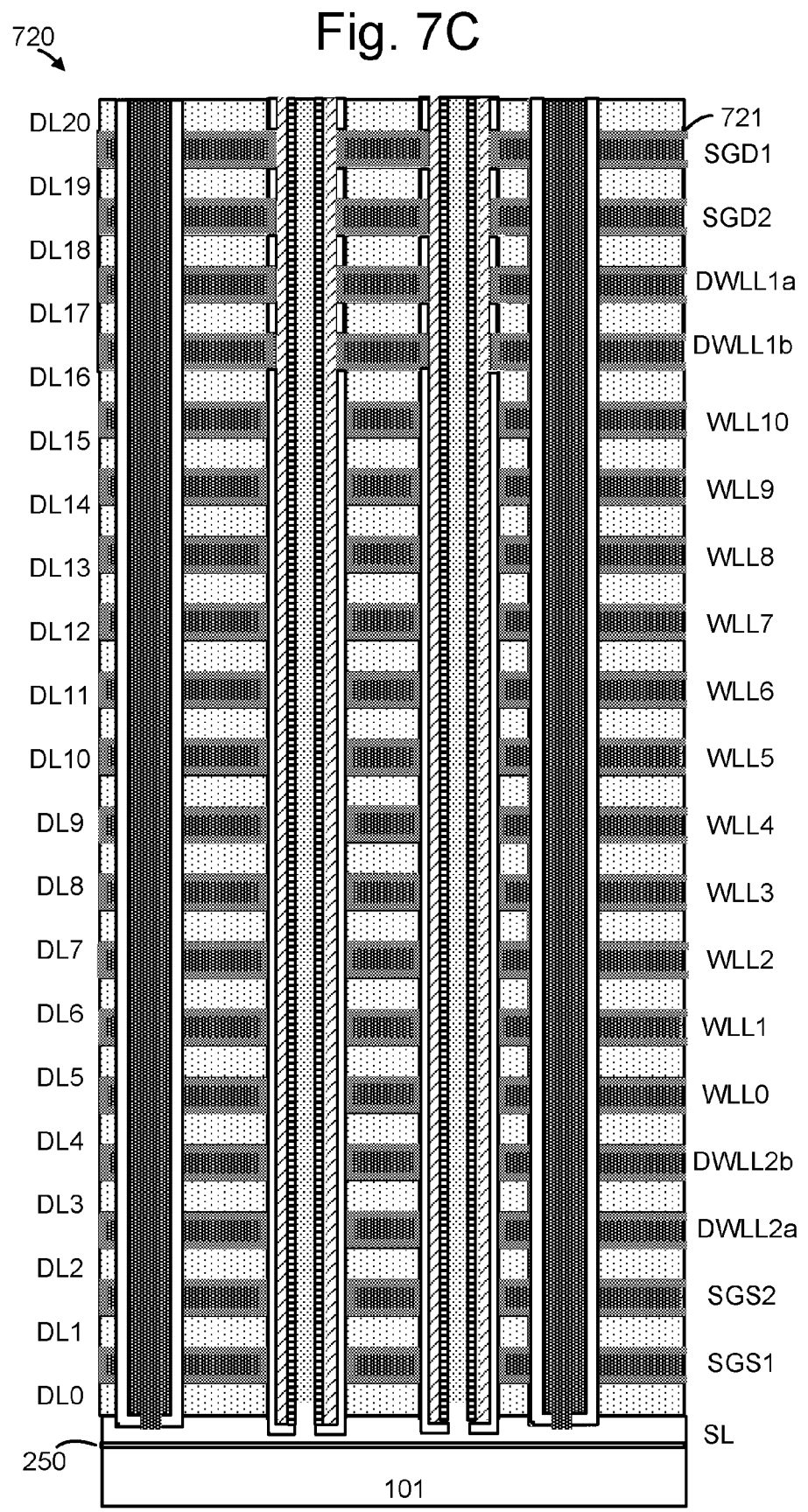
FIG. 7C depicts a semiconductor structure 720 obtained by processing the semiconductor structure of FIG. 7B in accordance with steps 509, 511, 512 and 513 of FIG. 5.

FIG. 7C depicts a semiconductor structure 720 obtained by processing the semiconductor structure of FIG. 7B in accordance with steps 509, 511, 512 and 513 of FIG. 5. In step 512, in particular, a blocking oxide layer 721 can be deposited in the voids of the control gate layers before the metal is deposited.

Figure 8A:
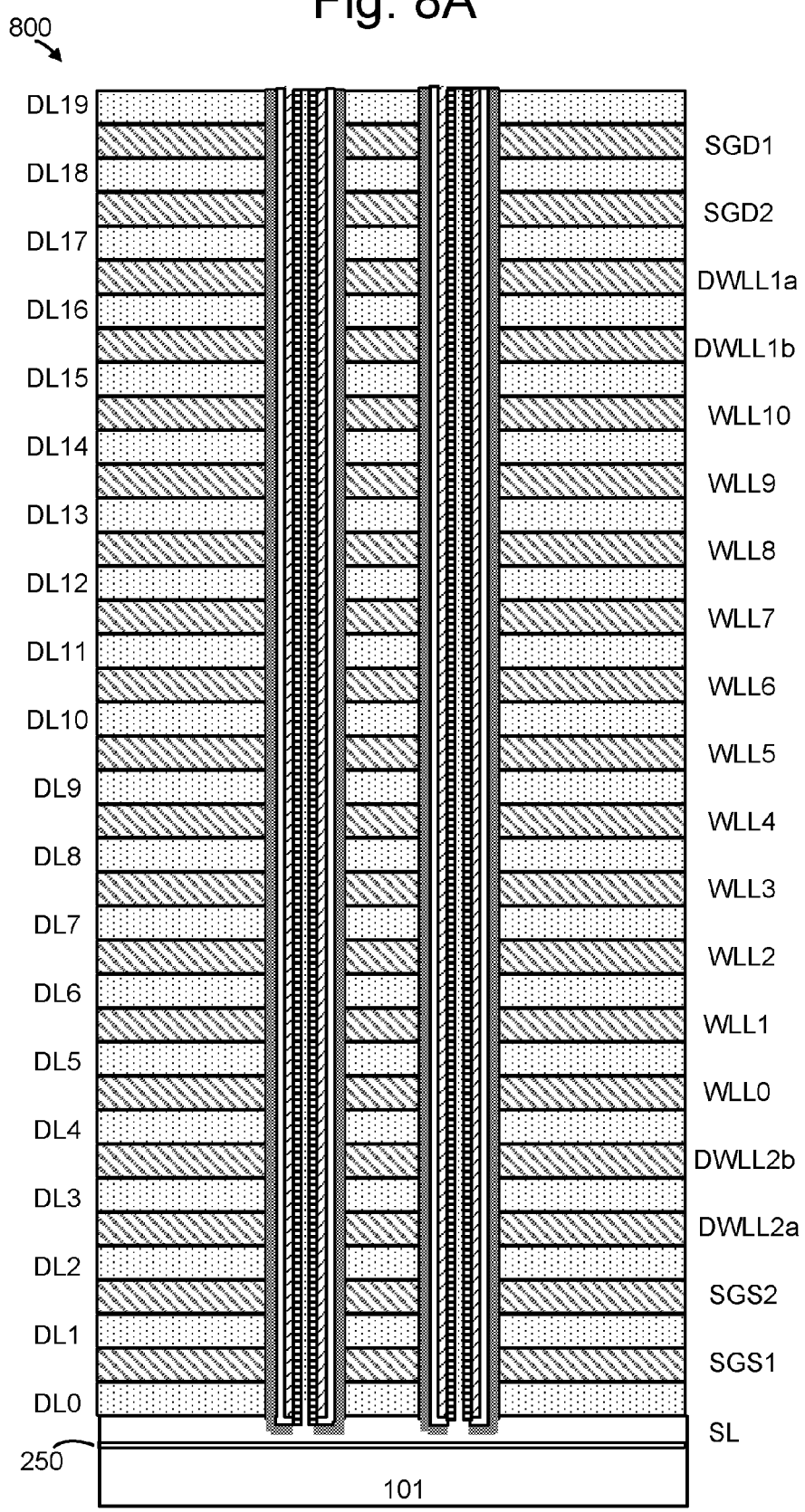
FIG. 8A depicts a semiconductor structure 800 obtained by processing a semiconductor structure in accordance with step 500b of FIG. 5.

FIG. 8A depicts a semiconductor structure 800 obtained by processing a semiconductor structure in accordance with step 500*b* of FIG. 5. In this case, all of the control gate layers comprise a common sacrificial material, e.g., SiN. The initial fabrication of the stack is therefore simplified compared to the case of using different sacrificial materials.

Figure 8B:
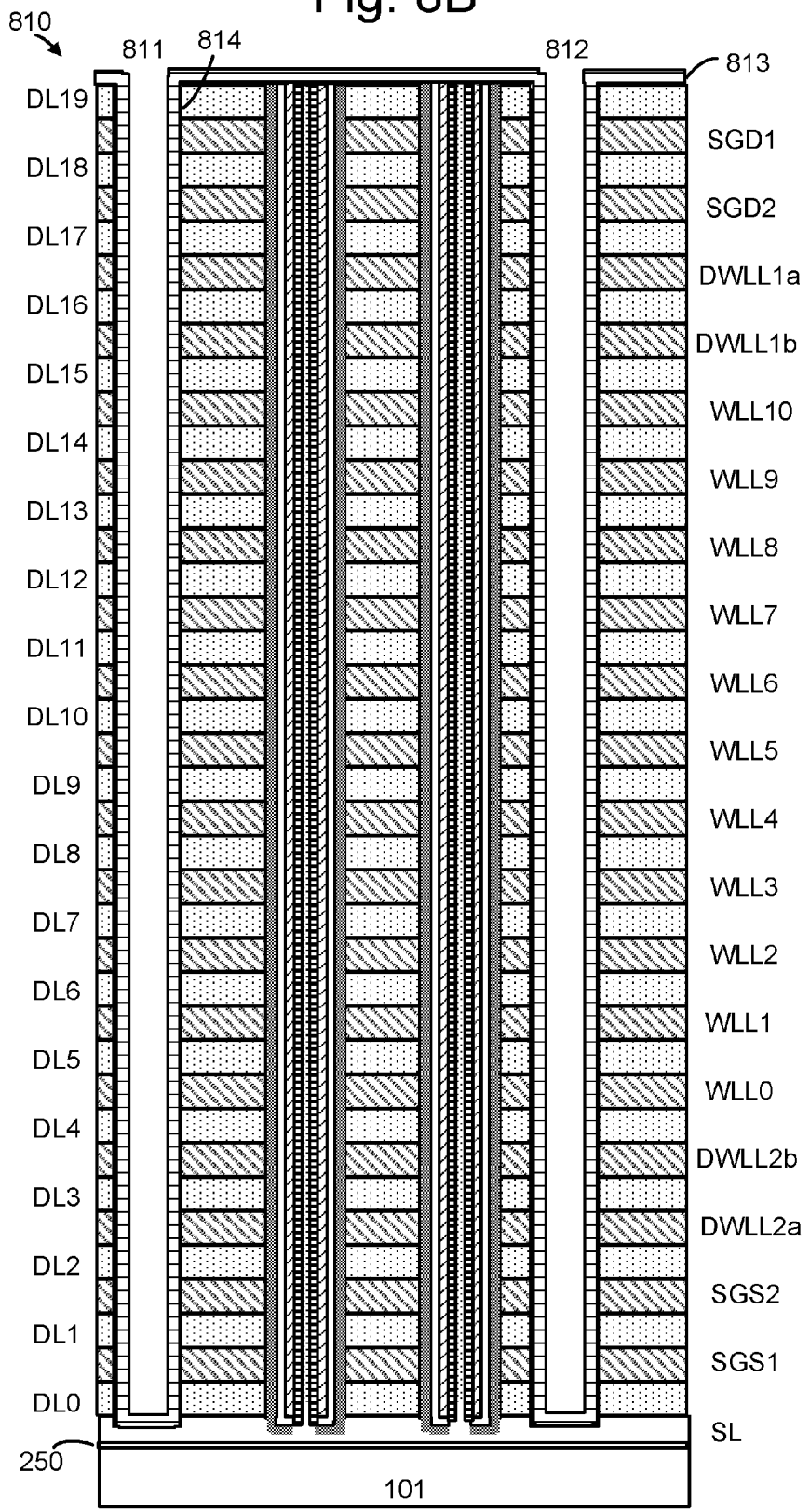
FIG. 8B depicts a semiconductor structure 810 obtained by processing the semiconductor structure of FIG. 8A in accordance with step 506a of FIG. 5.

FIG. 8B depicts a semiconductor structure 810 obtained by processing the semiconductor structure of FIG. 8A in accordance with step 506*a* of FIG. 5. After the slits 811 and 812 are etched, a protective layer 813 is deposited in the slits and extends along sidewalls 814 of the slits.

Figure 8C:
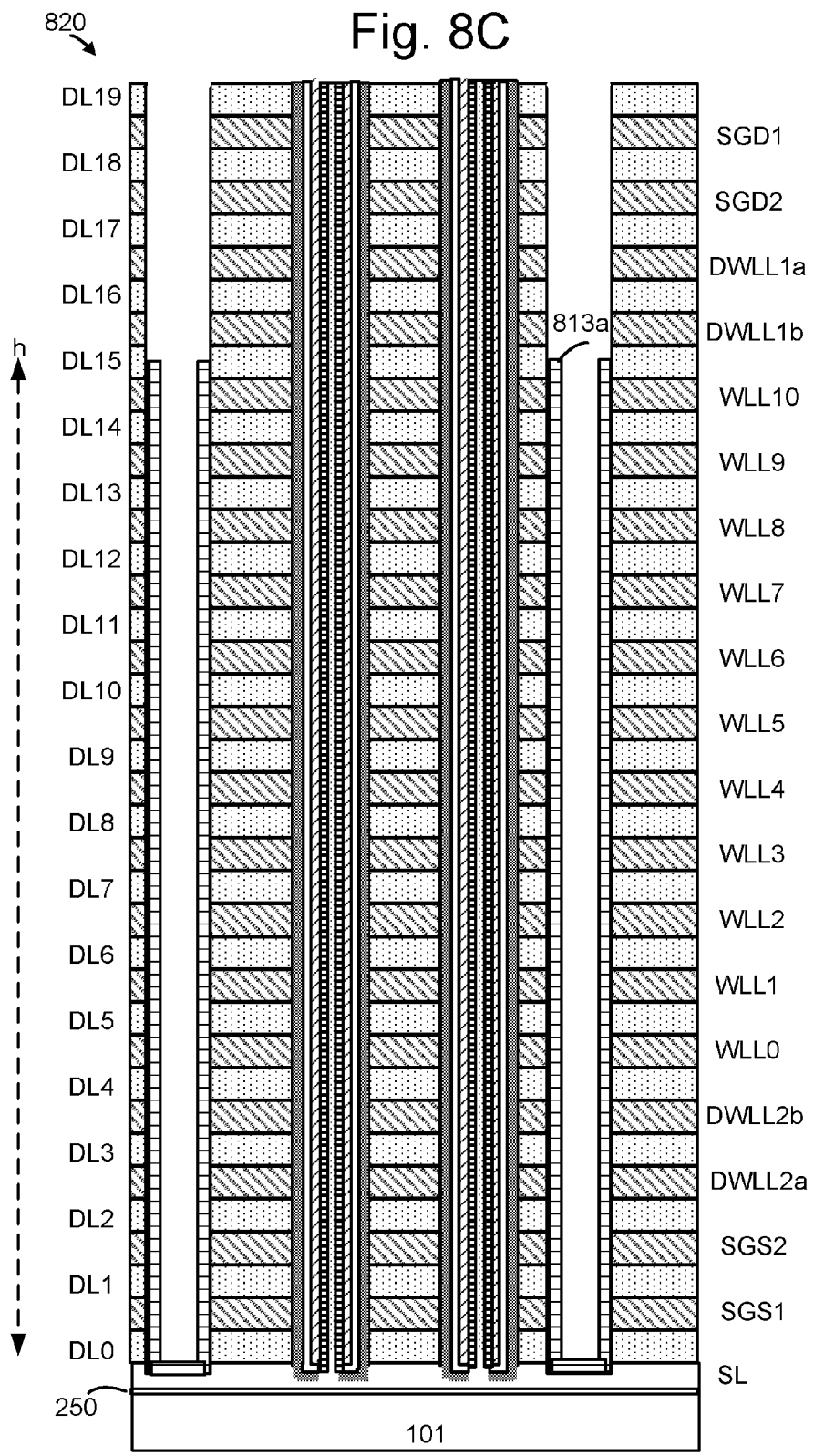
FIG. 8C depicts a semiconductor structure 820 obtained by processing the semiconductor structure of FIG. 8B in accordance with step 506b of FIG. 5.

FIG. 8C depicts a semiconductor structure 820 obtained by processing the semiconductor structure of FIG. 8B in accordance with step 506*b* of FIG. 5. The protective layer is etched down to a specified height h in the stack which is, e.g., between a bottommost control gate layer (DWLL1*b*) of the control gate layers for the dummy memory cells and/or the select gate transistors and a topmost control gate layer (WLL10) of the control gate layers for the data memory cells. That is, the specified height is defined such that the charge-trapping material is removed from the control gate layers which are above the height but not from the control gate layers which are below the height. A remaining portion 813*a* of the protective layer shields the sacrificial material of the control gate layers below the height h in the stack from an etchant in the slit, so that the etchant is used to remove the sacrificial material of the control gate layers above but not below the height h in the stack.

Figure 8D:
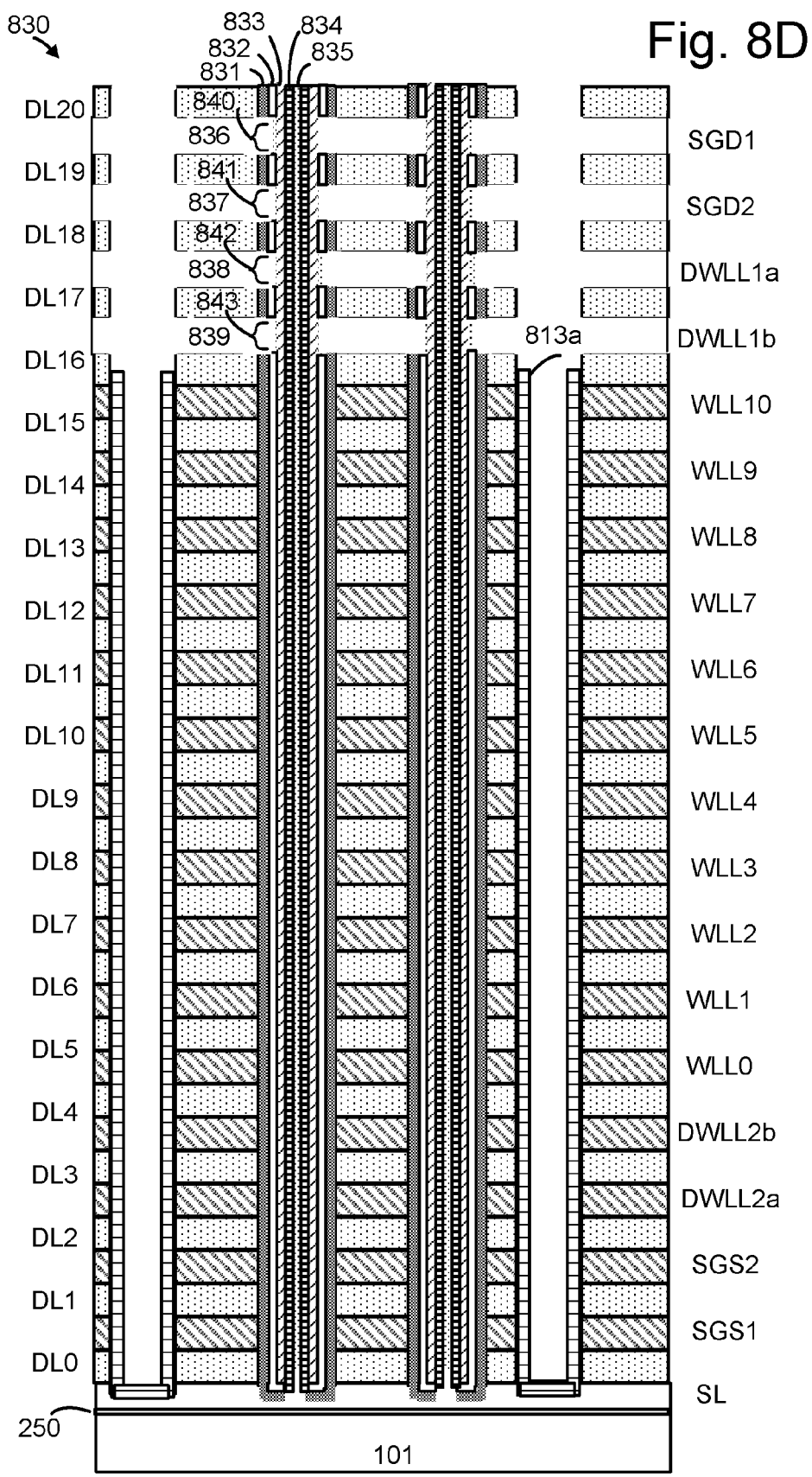
FIG. 8D depicts a semiconductor structure 830 obtained by processing the semiconductor structure of FIG. 8C in accordance with steps 507, 508 and 509 of FIG. 5.

FIG. 8D depicts a semiconductor structure 830 obtained by processing the semiconductor structure of FIG. 8C in accordance with steps 507, 508 and 509 of FIG. 5. An etchant is provided via the slits to remove the sacrificial material of the control gate layers above the height h in the stack. Additional etchants can remove portions of the blocking oxide layer 831 and the charge-trapping layer 832 and thereby expose portions of the tunneling material 833. The channel material 834 and core filler 835 are also depicted. Voids 836, 837, 838 and 839 are formed in SGD1, SGD2, DWLL1*a* and DWLL1*b*, respectively. Exposed portions 840, 841, 842 and 843 of the tunneling material 833 are also depicted.

Subsequently, steps 510, 511 and 513 can be performed to obtain the semiconductor structure of FIG. 6M, or steps 510, 511, 512 and 513 can be performed to obtain the semiconductor structure of FIG. 7C, for example.

Figure 9A:
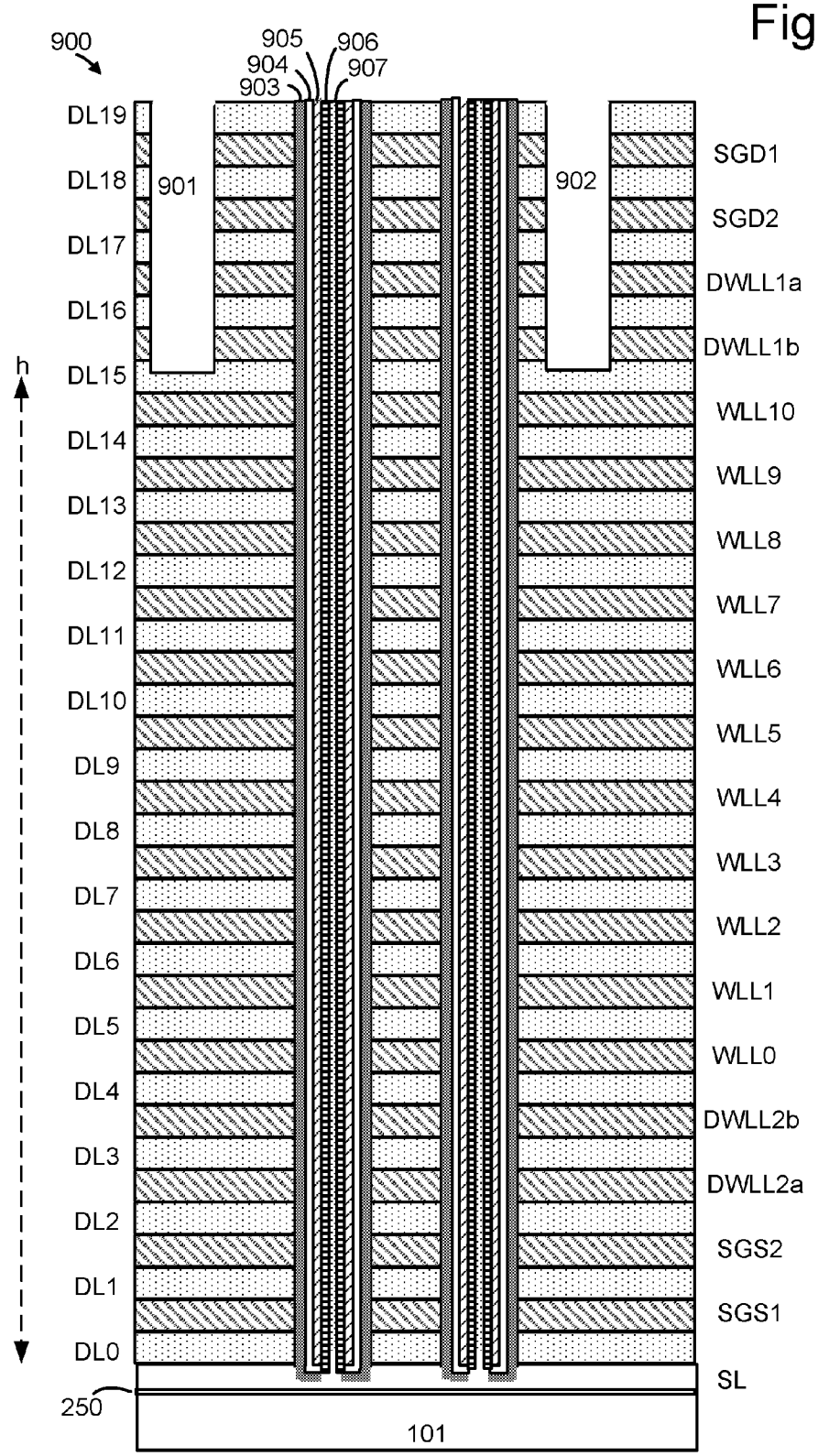
FIG. 9A depicts a semiconductor structure 900 obtained by processing the semiconductor structure of FIG. 8A in accordance with step 505 of FIG. 5.

FIG. 9A depicts a semiconductor structure 900 obtained by processing the semiconductor structure of FIG. 8A in accordance with step 505 of FIG. 5. In this case, the etching of the slits can occurs in two steps. In a first step, the slits are etched partway down the stack, to the specified height h in the stack which is, e.g., between a bottommost control gate layer of the control gate layers for the dummy memory cells and/or the select gate transistors and a topmost control gate layer of the control gate layers for the data memory cells. Partial slits 901 and 902 are formed. The control gate layers which are above but not below this height are then processed to remove the sacrificial material and the charge-trapping material, such as depicted in FIG. 9B. In a second step, the slits are etched down to the bottom of the stack and full slits are formed, such as the slit 641 or 642 in FIG. 6I. The control gate layers which are below the height h are then processed to remove the sacrificial material. In this approach, a common sacrificial material may be used for all of the control gate layers. In the memory holes, the blocking oxide layer 903, charge-trapping layer 904, tunneling material 905, channel material 906 and core filler 907 are also depicted.

FIG. 9B depicts a semiconductor structure 910 obtained by processing the semiconductor structure of FIG. 9A in accordance with steps 507 and 509*b* of FIG. 5. An etchant is provided via the slits to remove the sacrificial material of the control gate layers above the height h in the stack. Additional etchants can remove portions of the blocking oxide layer 903 and the charge-trapping layer 904 and thereby expose portions of the tunneling material 905. Specifically, exposed portions 915, 916, 917 and 918 of the tunneling material 905 are also depicted. The channel material 906 and core filler 907 are also depicted. Voids 911, 912, 913 and 914 are formed in SGD1, SGD2, DWLL1*a* and DWLL1*b*, respectively.

While many of the above figures depict a straight NAND string configuration, the techniques described herein can be applied to a U-shaped NAND string as well. As depicted in FIG. 2C, for example, a single layer of the stack can includes both drain-side and source-side select gate transistors or dummy memory cells. As a result, the processing of the single layer can result in removal of the charge-trapping material from the drain-side and source-side select gate transistors or dummy memory cells.

Accordingly, it can be seen that, in one embodiment, a method for fabricating a memory device (100) comprises: a) forming a stack (231, 376, 440) comprising alternating control gate layers (SGS1, SGS2, DWLL2*a* and DWLL2*b*, WLL0-WLL10, DWLL1*b*, DWLL1*a*, SGD2 and SGD1) and dielectric layers (D0-D19), the control gate layers of the stack comprise a control gate layer (SGS1, SGS2, DWLL2*a* and DWLL2*b*) for a first transistor (490-493) above control gate layers (WLL0-WLL10) for data memory cells (MC), the control gate layer for the first transistor comprises a first sacrificial material (602, 603) and the control gate layers for the data memory cells comprises a second sacrificial material (604); b) forming a memory hole (410, 411, 611, 612, MH0-MH3, MHx, MHy) in the stack, the memory hole having a sidewall (814, SW); c) depositing a charge-trapping material (622, 622*a*, 701, 701*a*, 832, 904), a tunneling material (TM, 464) and a channel material (623, 623*a*, 703, 703*a*, 834, 906) along the sidewall, wherein the charge-trapping material is deposited before the tunneling material, and the tunneling material is deposited before the channel material; d) etching a slit (206, 239-243, 245, 247, 248, 346-348, 357-361, 641, 642, 811, 812) in the stack; e) providing an etchant in the slit which is more selective of the first sacrificial material than the second sacrificial material to etch away the first sacrificial material, creating a void (651-654, 651*a*-654*a*, 711-714, 836-839, 911-914) in the control gate layer for the first transistor and exposing a portion (651*c*, 652*c*, 653*c* and 654*c*) of the charge-trapping material in the control gate layer for the first transistor; f) providing an etchant in the slit to etch away the portion of the charge-trapping material which is in the control gate layer for the first transistor; g) providing an etchant in the slit to etch away the second sacrificial material, creating voids (671-679, 671a-676a) in the control gate layers for the data memory cells; h) depositing a metal (681) in the slit, the metal fills the void in the control gate layer for the first transistor and the voids in the control gate layers for the data memory cells, wherein portions (MCb) of the charge-trapping material in the control gate layers for the data memory cells remain in the memory device; and i) providing a blocking oxide layer (471, 621, 621a, 691, 721, 831, 903) between the charge-trapping material and the metal.

In another embodiment, a method for fabricating a memory device comprises: a) forming a stack comprising alternating control gate layers and dielectric layers, the control gate layers of the stack comprise a control gate layer for a first transistor above control gate layers for data memory cells; b) forming a memory hole in the stack, the memory hole having a sidewall; c) depositing a charge-trapping material, a tunneling material and a channel material along the sidewall, wherein the charge-trapping material is deposited before the tunneling material, and the tunneling material is deposited before the channel material; d) etching a slit in the stack; e) depositing a protective layer in the slit; f) etching down the protective layer to a height in the stack which is between the control gate layer for the first transistor and the control gate layers for the data memory cells, exposing a sacrificial material of the control gate layer for the first transistor to the slit and leaving a remaining portion of the protective layer which shields a sacrificial material of the control gate layers for the data memory cells from the slit; g) providing an etchant in the slit which etches away the sacrificial material of the control gate layer for the first transistor, creating a void in the control gate layer for the first transistor and exposing a portion of the charge-trapping material in the control gate layer for the first transistor; h) providing an etchant in the slit to etch away the portion of the charge-trapping material which is in the control gate layer for the first transistor; i) providing an etchant in the slit which etches away the remaining portion of the protective layer, exposing the sacrificial material of the control gate layers for the data memory cells to the slit; j) providing an etchant in the slit which etches away the sacrificial material of the control gate layers for the data memory cells, creating voids in the control gate layers for the data memory cells; k) depositing a metal in the slit, the metal fills the void in the control gate layer for the first transistor and the voids in the control gate layers for the data memory cells, wherein portions of the charge-trapping material in the control gate layers for the data memory cells remain in the memory device; and l) providing a blocking oxide layer between the charge-trapping material and the metal.

In another embodiment, a method for fabricating a memory device comprises: a) forming a stack comprising alternating control gate layers and dielectric layers, the control gate layers of the stack comprise a control gate layer for a first transistor above control gate layers for data memory cells; b) forming a memory hole in the stack, the memory hole having a sidewall; c) depositing a charge-trapping material, a tunneling material and a channel material along the sidewall, wherein the charge-trapping material is deposited before the tunneling material, and the tunneling material is deposited before the channel material; d) etching a slit in the stack down from a top of the stack to a height in the stack which is between the control gate layer for the first transistor and the control gate layers for the data memory cells; e) providing an etchant in the slit which etches away a sacrificial material of the control gate layer for the first transistor, creating a void in the control gate layer for the first transistor and exposing a portion of the charge-trapping material in the control gate layer for the first transistor; f) providing an etchant in the slit to etch away the portion of the charge-trapping material which is in the control gate layer for the first transistor; g) etching the slit down from the height to a bottom of the stack, exposing the sacrificial material of the control gate layers for the data memory cells to the slit; h) providing an etchant in the slit which etches away the sacrificial material of the control gate layers for the data memory cells, creating voids in the control gate layers for the data memory cells; i) depositing a metal in the slit, the metal fills the void in the control gate layer for the first transistor and the voids in the control gate layers for the data memory cells, wherein portions of the charge-trapping material in the control gate layers for the data memory cells remain in the memory device; and j) providing a blocking oxide layer between the charge-trapping material and the metal.

In another embodiment, a method for fabricating a memory device comprises: forming a stack comprising a plurality of layers, the plurality of layers comprise a first set of layers and a second set of layers above the first set of layers, the first set of layers comprises nitride layers alternating with oxide layers and the second set of layers comprises polysilicon layers alternating with oxide layers; forming a memory hole in the stack, the memory hole having a sidewall; depositing charge-trapping layers and a channel material along the sidewall, wherein the charge-trapping layers are deposited before the channel material; etching a void (e.g., slit) in the stack; providing an etchant in the void which is more selective of the polysilicon than the oxide or the nitride, creating voids in place of the polysilicon layers and exposing portions of the charge-trapping layers; providing an etchant in the void to etch away the portions of the charge-trapping layers; providing an etchant which is more selective of the nitride than the oxide, creating voids in place of the nitride layers and exposing other portions of the charge-trapping layers; and depositing a metal in the void, wherein the metal fills the voids in place of the polysilicon layers and the voids in place of the nitride layers, wherein the other portions of the charge-trapping layers remain in the memory device. The second set of layers comprise one or more select gate transistors and/or one or more dummy memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a memory device, comprising:
   forming a stack comprising alternating control gate layers and dielectric layers, the control gate layers of the stack comprise a control gate layer for a first transistor above control gate layers for data memory cells;
   forming a memory hole in the stack, the memory hole having a sidewall;
   depositing a charge-trapping material, a tunneling material and a channel material along the sidewall, wherein the charge-trapping material is deposited before the tunneling material, and the tunneling material is deposited before the channel material;

etching a slit in the stack;

depositing a protective layer in the slit;

etching down the protective layer to a height in the stack which is between the control gate layer for the first transistor and the control gate layers for the data memory cells, exposing a sacrificial material of the control gate layer for the first transistor to the slit and leaving a remaining portion of the protective layer which shields a sacrificial material of the control gate layers for the data memory cells from the slit;

providing an etchant in the slit which etches away the sacrificial material of the control gate layer for the first transistor, creating a void in the control gate layer for the first transistor and exposing a portion of the charge-trapping material in the control gate layer for the first transistor;

providing an etchant in the slit to etch away the portion of the charge-trapping material which is in the control gate layer for the first transistor;

providing an etchant in the slit which etches away the remaining portion of the protective layer, exposing the sacrificial material of the control gate layers for the data memory cells to the slit;

providing an etchant in the slit which etches away the sacrificial material of the control gate layers for the data memory cells, creating voids in the control gate layers for the data memory cells;

depositing a metal in the slit, the metal fills the void in the control gate layer for the first transistor and the voids in the control gate layers for the data memory cells, wherein portions of the charge-trapping material in the control gate layers for the data memory cells remain in the memory device; and providing a blocking oxide layer between the charge-trapping material and the metal.

2. The method of claim 1, wherein:

the control gate layer for the first transistor and the control gate layers for the data memory cells comprises a common sacrificial material.

3. The method of claim 1, wherein:

the sacrificial material of the control gate layer for the first transistor and the sacrificial material of the control gate layers for the data memory cells comprise silicon nitride.

4. The method of claim 1, wherein:

the first transistor comprises a select gate transistor.

5. The method of claim 1, wherein:

the first transistor comprises a dummy memory cell.

6. The method of claim 1, further comprising:

performing ion implantation at a top of the stack to provide a dopant in the channel material, the dopant is provided at a portion of the channel material which is in the control gate layer for the first transistor.

7. The method of claim 1, further comprising:

after the providing the etchant to etch away the portion of the charge-trapping material which is in the control gate layer for the first transistor, providing a dopant in the void in the control gate layer for the first transistor to expose the portion of the channel material in the control gate layer for the first transistor to the dopant.

8. The method of claim 1, wherein:

the providing the blocking oxide layer comprises depositing the blocking oxide layer via the slit, and the blocking oxide layer extends in the void in the control gate layer for the first transistor and in the voids in the control gate layers for the data memory cells.

9. The method of claim 1, wherein the providing the blocking oxide layer comprises depositing the blocking oxide layer along the sidewall before the depositing of the charge-trapping material, the method further comprising:

before the providing the etchant in the slit to etch away the portion of the charge-trapping material which is in the control gate layer for the first transistor, providing an etchant in the slit and in the void in the control gate layer for the first transistor to etch away a portion of the blocking oxide layer in the control gate layer for the first transistor.

10. The method of claim 9, further comprising:

providing an etchant in the slit and in the void in the control gate layer for the first transistor to etch away a portion of the blocking oxide layer which is in the control gate layer for the first transistor, before the providing the etchant in the slit to etch away the portion of the charge-trapping material which is in the control gate layer for the first transistor.

* * * * *